(12) United States Patent
Fulford et al.

(10) Patent No.: US 12,356,706 B2
(45) Date of Patent: Jul. 8, 2025

(54) METHODS FOR FORMING HIGH PERFORMANCE THREE DIMENSIONALLY STACKED TRANSISTORS BASED ON DIELECTRIC NANO SHEETS

(71) Applicant: Tokyo Electron Limited, Tokyo (JP)

(72) Inventors: H. Jim Fulford, Albany, NY (US); Mark I. Gardner, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 630 days.

(21) Appl. No.: 17/558,442

(22) Filed: Dec. 21, 2021

(65) Prior Publication Data

US 2023/0197715 A1 Jun. 22, 2023

(51) Int. Cl.
| | | |
|---|---|---|
| H10D 84/83 | (2025.01) | |
| H10D 30/01 | (2025.01) | |
| H10D 30/67 | (2025.01) | |
| H10D 62/10 | (2025.01) | |
| H10D 62/80 | (2025.01) | |

(Continued)

(52) U.S. Cl.
CPC ......... H10D 84/83 (2025.01); H10D 30/6729 (2025.01); H10D 30/6735 (2025.01); H10D 62/118 (2025.01); H10D 62/80 (2025.01); H10D 62/84 (2025.01); H10D 64/01 (2025.01); H10D 64/258 (2025.01); H10D 84/0128 (2025.01); H10D 84/013 (2025.01); H10D 84/0149 (2025.01); H10D 84/038 (2025.01); *H10D 30/031* (2025.01); *H10D 30/6713* (2025.01); *H10D 30/6757* (2025.01); *H10D 88/00* (2025.01)

(58) Field of Classification Search
CPC .......... H01L 27/088; H01L 21/823418; H01L 21/823475; H01L 27/0688; H01L 29/0653; H01L 29/0673; H01L 29/0847; H01L 29/41733; H01L 29/42392; H01L 21/823412; H01L 29/0665; H10D 84/83; H10D 84/013; H10D 84/0128
See application file for complete search history.

(56) References Cited

U.S. PATENT DOCUMENTS

| | | | |
|---|---|---|---|
| 7,768,051 B2 | 8/2010 | Abbott | |
| 9,024,376 B2 | 5/2015 | Masuoka et al. | |

(Continued)

FOREIGN PATENT DOCUMENTS

| | | | | |
|---|---|---|---|---|
| DE | 102020112108 A1 | * | 12/2020 | ........... H01L 27/092 |
| KR | 20200135720 A | * | 12/2020 | ....... H01L 29/78696 |

*Primary Examiner* — Fazli Erdem
*Assistant Examiner* — Alden Tennison
(74) *Attorney, Agent, or Firm* — Foley & Lardner LLP

(57) ABSTRACT

A device including one or more transistors with nano sheets stacked along a vertical direction, and a method of fabricating the device are disclosed herein. In some embodiments, a device includes a transistor structure including at least a first dielectric nano sheet and a second dielectric nano sheet. The first dielectric nano sheet and the second dielectric nano sheet may extend parallel to a substrate. The second dielectric nano sheet may be disposed above the first dielectric nano sheet. The transistor may include a first source/drain structure coupled to a first end of the first dielectric nano sheet and a first end of the second dielectric nano sheet, and a second source/drain structure coupled to a second end of the first dielectric nano sheet and a second end of the second dielectric nano sheet.

11 Claims, 32 Drawing Sheets

(51) Int. Cl.
    *H10D 62/84*     (2025.01)
    *H10D 64/01*     (2025.01)
    *H10D 64/23*     (2025.01)
    *H10D 84/01*     (2025.01)
    *H10D 84/03*     (2025.01)
    *H10D 88/00*     (2025.01)

(56) References Cited

U.S. PATENT DOCUMENTS

| | | |
|---|---|---|
| 9,425,324 B2 | 8/2016 | Diaz et al. |
| 9,478,624 B2 | 10/2016 | Colinge et al. |
| 2011/0260225 A1 | 10/2011 | Lee |
| 2014/0017890 A1 | 1/2014 | Cohen et al. |
| 2018/0061835 A1 | 3/2018 | Yang et al. |
| 2018/0061837 A1 | 3/2018 | Mathew et al. |
| 2018/0204833 A1 | 7/2018 | Cheng et al. |
| 2020/0357931 A1* | 11/2020 | Lee .................... H01L 29/0673 |
| 2020/0373203 A1* | 11/2020 | Liebmann ....... H01L 21/823871 |
| 2021/0280582 A1 | 9/2021 | Lu et al. |
| 2022/0328670 A1 | 10/2022 | Lee et al. |
| 2023/0088101 A1 | 3/2023 | Naylor et al. |
| 2023/0099814 A1 | 3/2023 | Maxey et al. |

\* cited by examiner

2900

```
┌─────────────────────────────────────────────────────────────────────┐
│ Form a set of initial dielectric layers and a set of initial        │
│ dielectric nano sheets                                              │
│ 2910                                                                │
└─────────────────────────────────────────────────────────────────────┘
                                    ▼
┌─────────────────────────────────────────────────────────────────────┐
│ Form trenches in the set of initial dielectric layers and the set   │
│ of initial dielectric nano sheets to obtain a set of unit dielectric│
│ layers and a set of unit dielectric nano sheets                     │
│ 2920                                                                │
└─────────────────────────────────────────────────────────────────────┘
                                    ▼
┌─────────────────────────────────────────────────────────────────────┐
│ Obtain a set of dielectric layers and a set of dielectric nano sheets│
│ 2930                                                                │
└─────────────────────────────────────────────────────────────────────┘
                                    ▼
┌─────────────────────────────────────────────────────────────────────┐
│ Form source/drain structures                                        │
│ 2940                                                                │
└─────────────────────────────────────────────────────────────────────┘
                                    ▼
┌─────────────────────────────────────────────────────────────────────┐
│ Remove the set of dielectric layers                                 │
│ 2950                                                                │
└─────────────────────────────────────────────────────────────────────┘
                                    ▼
┌─────────────────────────────────────────────────────────────────────┐
│ Form channel regions                                                │
│ 2960                                                                │
└─────────────────────────────────────────────────────────────────────┘
                                    ▼
┌─────────────────────────────────────────────────────────────────────┐
│ Form gate dielectric regions                                        │
│ 2970                                                                │
└─────────────────────────────────────────────────────────────────────┘
                                    ▼
┌─────────────────────────────────────────────────────────────────────┐
│ Form gate structures                                                │
│ 2980                                                                │
└─────────────────────────────────────────────────────────────────────┘
```

Deposit metal in a trench to fill indents, portions of the metal in the indents contacting a set of dielectric nano sheets
3010

Remove a portion of the metal in the trench along a vertical direction
3020

Deposit a dielectric material in the trench to fill the removed portion
3030

Selectively grow metal in indents, the metal in the indents contacting a set of dielectric nano sheets, a portion of the metal overgrown out of each indent contacting another portion of the metal overgrown out of its adjacent indent
3110

Deposit a dielectric material in the trench
3120

METHODS FOR FORMING HIGH PERFORMANCE THREE DIMENSIONALLY STACKED TRANSISTORS BASED ON DIELECTRIC NANO SHEETS

TECHNICAL FIELD

The present disclosure relates generally to the field of manufacturing transistors.

BACKGROUND

In the manufacture of semiconductor devices, various fabrication processes are executed, such as film-forming depositions, etch mask creation, patterning, material etching and removal, and doping treatments. These processes may be performed to form semiconductor device components on a substrate. Some example fabrication techniques allow the manufacture of transistors on a single active device plane, while wiring or metallization is formed above the active device plane. Such devices are accordingly characterized as two-dimensional (2D) circuits, manufactured using 2D fabrication techniques. Although scaling efforts have greatly increased the number of transistors per unit area in 2D circuits, these 2D fabrication techniques are approaching physical atomic limitations with single digit nanometer semiconductor device fabrication nodes.

SUMMARY

Three-dimensional (3D) integration, e.g., a stacking (or vertical arrangement) of multiple semiconductor devices (e.g., transistor structures), aims to overcome scaling limitations experienced in planar devices by increasing transistor density in volume rather than area.

At least one aspect of the present disclosure is directed to a device that includes a substrate and a transistor structure. The transistor structure may include a first dielectric nano sheet extending in a direction parallel to the substrate, and a second dielectric nano sheet disposed above the first dielectric nano sheet and extending in the direction parallel to the substrate. The transistor structure may include a first source/drain structure coupled to a first end of the first dielectric nano sheet and a first end of the second dielectric nano sheet, and a second source/drain coupled to a second end of the first dielectric nano sheet and a second end of the second dielectric nano sheet.

The transistor structure may further include a first channel region on the first dielectric nano sheet, and a second channel region on the second dielectric nano sheet. In some implementations, the first channel region and the second channel region may include a 2D material (e.g., $WS_2$, $WSe_2$, $WTe_2$, $MoS_2$, $MoSe_2$, $MoTe_2$, $HfS_2$, $ZrS_2$, $TiS_2$, GaSe, InSe, phosphorene).

The transistor structure may further include a first gate dielectric region on the first channel region. The transistor structure may further include a first gate structure on the first gate dielectric region. The transistor structure may further include a second gate dielectric region on the second channel region. The transistor structure may further include a second gate structure on the second gate dielectric region.

The device can further include a second transistor structure disposed above the transistor structure. The second transistor may include a third dielectric nano sheet disposed above the second dielectric nano sheet. The second transistor structure may include a fourth dielectric nano sheet. The fourth dielectric nano sheet may be disposed above the third dielectric nano sheet. The second transistor structure may include a third source/drain structure coupled to a first end of the third dielectric nano sheet and a first end of the fourth dielectric nano sheet. The second transistor may include a fourth source/drain structure coupled to a second end of the third dielectric nano sheet and a second end of the fourth dielectric nano sheet.

The first source/drain structure may include a first contact portion directly coupled to the first end of the first dielectric nano sheet, a second contact portion directly coupled to the first end of the second dielectric nano sheet, and a bridge portion coupled to the first contact portion and the second contact portion. In some implementations, the second source/drain structure may include a third contact portion directly coupled to the second end of the first dielectric nano sheet, a fourth contact portion directly coupled to the second end of the second dielectric nano sheet, and a second bridge portion coupled to the third contact portion and the fourth contact portion.

One method may include forming a set of dielectric layers and a set of dielectric nano sheets above a substrate. Each of the set of dielectric layers and each of the set of dielectric nano sheets may be formed to extend parallel to the substrate. The substrate, the set of dielectric layers and the set of dielectric nano sheets may be stacked. Each of the set of dielectric nano sheets may be interposed between corresponding two dielectric layers of the set of dielectric layers. The method may further include forming a first source/drain structure and a second source/drain structure. The first source/drain structure may be coupled to first ends of the set of dielectric nano sheets. The second source/drain structure may be coupled to second ends of the set of dielectric nano sheets.

The method may further include removing the set of dielectric layers, forming channel regions on the set of dielectric nano sheets, forming gate dielectric regions on the channel regions, and forming gate structures on the gate dielectric regions. The channel regions may be formed by including at least one of WS2, WSe2, WTe2, MoS2, MoSe2, MoTe2, HfS2, ZrS2, TiS2, GaSe, InSe, or phosphorene.

Removing the set of dielectric layers may include placing a photoresist mask to cover the first source/drain structure and the second source/drain structure. The photoresist mask may have an opening that exposes the set of dielectric layers. Removing the set of dielectric layers may further include etching the set of dielectric layers through the opening of the photoresist mask.

The set of dielectric layers may be a first set of dielectric layers and the set of dielectric nano sheets may be a first set of dielectric nano sheets. The method may include forming, a second set of dielectric layers and a second set of dielectric nano sheets above the set of dielectric layers and the set of dielectric nano sheets. Each of the second set of dielectric layers and each of the second set of dielectric nano sheets may extend along a first direction. The second set of dielectric layers and the second set of dielectric nano sheets may be stacked along a second direction. Each of the second set of dielectric nano sheets may be interposed between corresponding two dielectric layers of the second set of dielectric layers. The method may include forming a third source/drain structure and a fourth source/drain structure. The third source/drain structure may be coupled to third ends of the second set of dielectric nano sheets. The fourth source/drain structure may be coupled to fourth ends of the second set of dielectric nano sheets. The third source/drain structure may be formed above the first source/drain structure, and the fourth source/drain structure may be formed above the second source/drain structure.

The second set of dielectric layers and the second set of dielectric nano sheets may be formed prior to forming the first source/drain structure, the second source/drain structure, the third source/drain structure, and the fourth source/drain structure.

The method may further include removing the first set of dielectric layers and the second set of dielectric layers, after forming the first source/drain structure, the second source/drain structure, the third source/drain structure, and the fourth source/drain structure. The method may include forming channel regions on the first set of dielectric nano sheets and the second set of dielectric nano sheets, after removing the first set of dielectric layers and the second set of dielectric layers. Gate dielectric regions may be formed on the channel regions. Gate structures may be formed on the gate dielectric regions. In some implementations, the method may include i) removing the first set of dielectric layers and the second set of dielectric layers, ii) forming the channel regions on the first set of dielectric nano sheets and the second set of dielectric nano sheets, iii) forming the gate dielectric regions on the channel regions, and iv) forming the gate structures on the gate dielectric regions may be performed, while a capping layer is above the first set of dielectric nano sheets and the second set of dielectric nano sheets. The channel regions may be formed on all exposed sides of the first and second sets of dielectric nano sheets, the gate dielectric regions may be formed on all exposed sides of the channels, and the gate structures may be formed on all exposed sides of the gate dielectric regions.

The gate structures formed on each of the first set of dielectric nano sheets may extend between the dielectric nano sheets of the first set of dielectric nano sheets as part of a first gate all around (GAA) structure, and the gate structures formed on each of the second set of dielectric nano sheets may extend between the dielectric nano sheets of the second set of dielectric nano sheets as part of a second GAA structure. A portion of material from each side of each of the dielectric layers in the set of dielectric layers may be removed. Dielectric structures of a different dielectric material may be formed to each area created by the removing the portion of material. A portion of the dielectric nano sheets between the dielectric structures on either side of each dielectric nano sheet may be removed to form indents.

The first source/drain structure and the second source/drain structure may be formed by depositing metal in the indents in an area outside of the indents, and removing a portion of the metal in the area outside the indents.

The first source/drain structure and the second source/drain structure may be formed by selectively growing metal in the indents. A portion of the metal may extend out of the indents.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of simplicity, not every component may be labeled in every drawing. In the drawings:

FIG. 29 is a flow chart showing a process of forming one or more transistors including vertically stacked nano sheets, according to an embodiment;

FIG. 30 is a flow chart showing a process of forming source/drain structures, according to an embodiment.

DETAILED DESCRIPTION

Figure 1A:
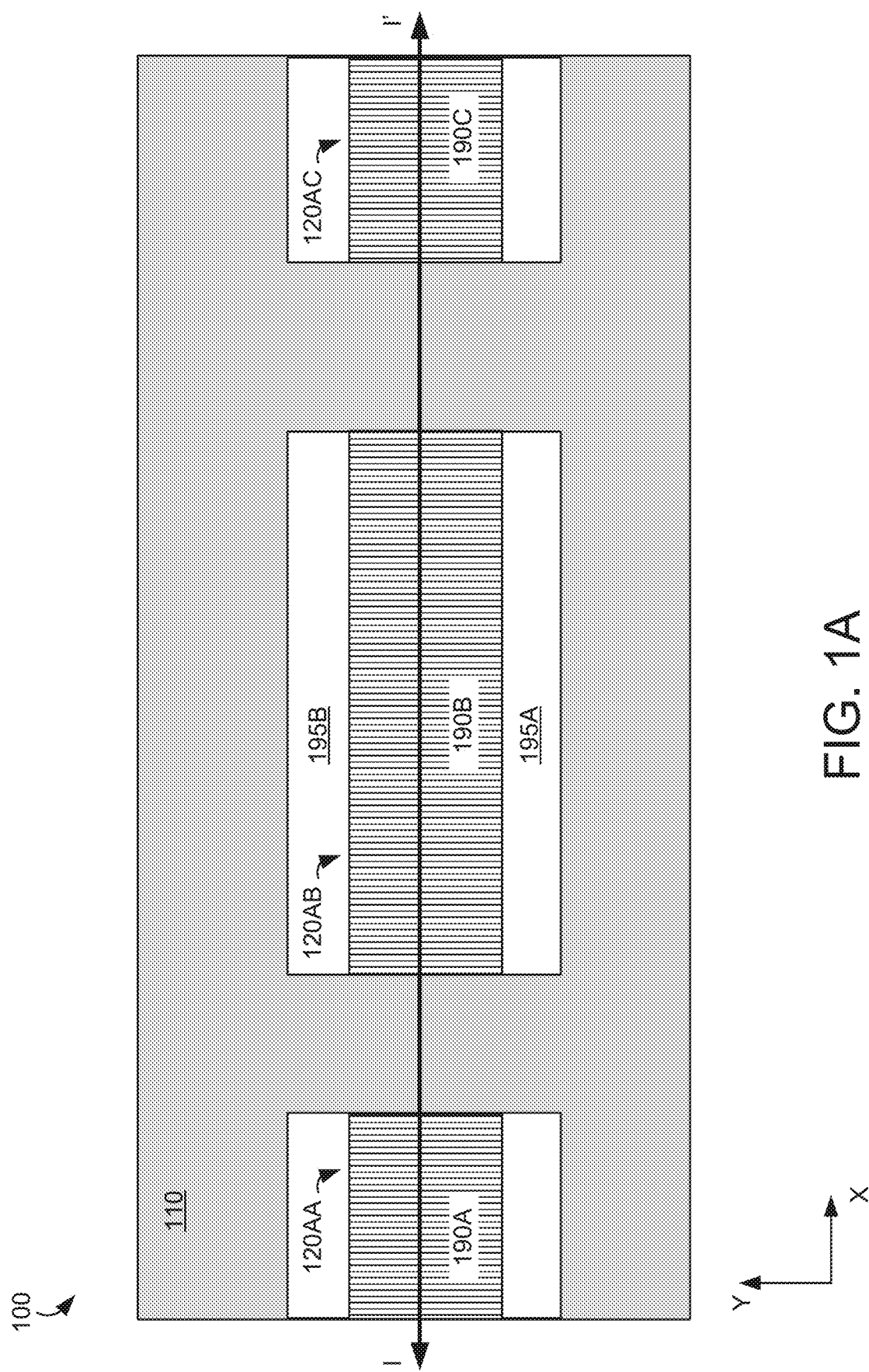
FIG. 1A is a top plan view of a device including stacked transistors, according to an embodiment.

Reference will now be made to the illustrative embodiments depicted in the drawings, and specific language will be used here to describe the same. It will nevertheless be understood that no limitation of the scope of the claims or this disclosure is thereby intended. Alterations and further modifications of the inventive features illustrated herein, and additional applications of the principles of the subject matter illustrated herein, which would occur to one skilled in the relevant art and having possession of this disclosure, are to be considered within the scope of the subject matter disclosed herein. Other embodiments may be used and/or other changes may be made without departing from the spirit or scope of the present disclosure. The illustrative embodiments described in the detailed description are not meant to be limiting of the subject matter presented.

The techniques provided herein can utilize conductive dielectric materials (sometimes referred to herein as "conductive channels"), which may have similar properties to semiconductor materials, to fabricate vertical 3D transistors. For example, certain materials, when combined with oxygen, may form new materials that exhibit semiconductor properties (e.g., it can turn "OFF" with low off-state leakage current, or can become highly conductive under certain circumstances, etc.). Some examples of N-type conductive channels include $In_2O_3$, $SnO_2$, InGaZnO, and ZnO. One example of a P-type conductive channel is SnO. Additionally or alternatively, the channel may comprise a 2D material. Some example 2D materials for use in forming the channel include, but are not limited to, $WS_2$, $WSe_2$, $WTe_2$, $MoS_2$, $MoSe_2$, $MoTe_2$, $HfS_2$, $ZrS_2$, $TiS_2$, GaSe, InSe, phosphorene, and other similar materials. These materials may be deposited by an atomic layer deposition (ALD) process and may be 5-15 angstroms thick, the thinness lending to their name—2D material. The materials may be annealed during or after the device formation process to recrystallize or grow the crystals and thereby improve electrical characteristics. For the sake of simplicity, the use of conductive dielectrics will be disclosed.

Disclosed herein are embodiments related to one or more transistor structures formed with nano sheet stacks. In some embodiments, a device includes a substrate and a transistor structure including at least a first dielectric nano sheet and a second dielectric nano sheet. The first dielectric nano sheet and the second dielectric nano sheet may extend parallel to the substrate (e.g., horizontal direction). The second dielectric nano sheet may be disposed above the first dielectric nano sheet (e.g., vertical direction). The transistor may include a first source/drain structure coupled to a first end of the first dielectric nano sheet and a first end of the second dielectric nano sheet, and a second source/drain structure coupled to a second end of the first dielectric nano sheet and a second end of the second dielectric nano sheet. The device may include additional stacked nano sheets. The device may include one or more additional stacked transistor structures. The transistor may further include a first channel region on the first dielectric nano sheet, and a second channel region on the second dielectric nano sheet. Each of the first channel region and the second channel region may include a 2D material.

In one approach, a process of forming the device may include forming a set of dielectric layers and a set of dielectric nano sheets. Each of the set of dielectric layers and each of the set of dielectric nano sheets may extend parallel to a substrate (e.g., horizontal direction). The set of dielectric layers and the set of dielectric nano sheets may be stacked. Each of the set of dielectric nano sheets may be interposed between corresponding two dielectric layers of the set of dielectric layers. The process may include forming a first source/drain structure and a second source/drain structure. The first source/drain structure may be coupled to first ends of the set of dielectric nano sheets stacked along the second direction. The second source/drain structure may be coupled to second ends of the set of dielectric nano sheets. The method may include removing the set of dielectric layers, forming channel regions on the set of dielectric nano sheets, forming gate dielectric regions on the channel regions, and forming gate structures on the gate dielectric regions. The channel regions may include 2D materials.

Advantageously, transistors including the dielectric nano sheets disclosed herein may be formed as gate all around (GAA) transistor structures with 2D materials. In one aspect, any number of nano sheets can be easily stacked to form a single transistor structure having improved characteristics in an area efficient manner. In one aspect, any number of transistor structures can be stacked (e.g., vertical direction) to improve area efficiency. In one aspect, 2D materials allow significant boost in performance relative to Si, such that transistor structures disclosed herein may have improved performances or characteristics (e.g., improved transconductance gm, improved gain bandwidth Ft, improved saturation current Idsat, etc.). In one aspect, a base substrate may be implemented in non-silicon materials, such that the process of forming transistor structures can be performed with low Dt thereby allowing higher density of stacking, particularly in the vertical stacking direction.

Reference will now be made to the figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein.

Figure 1B:
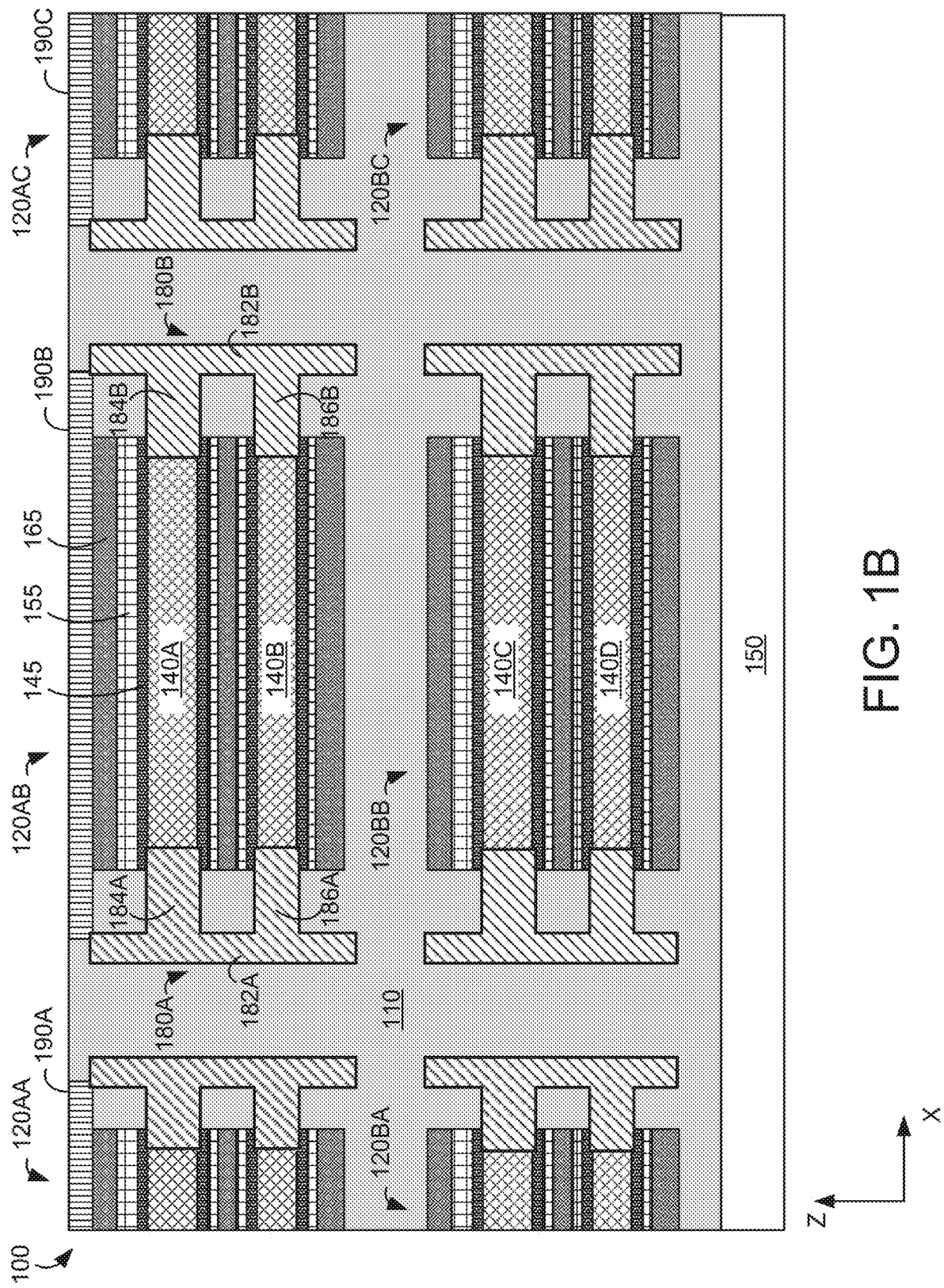
FIG. 1B is a cross-sectional view of the device including the stacked transistors, according to an embodiment.

FIG. 1A is a top plan view of a device 100 including stacked transistors 120, according to an embodiment, and FIG. 1B is a cross-sectional view of the device 100 including the stacked transistors, according to an embodiment. In some embodiments, the device 100 includes a substrate 150. The substrate 150 may be any structure on which a dielectric structure 110 can be formed on the substrate (e.g., along the Z-direction). The substrate 150 may include non-conductive materials or materials other than silicon (Si). Within the dielectric structure 110, transistors 120AA . . . 120BC (collectively or individually transistor 120) can be formed. In some embodiments, the device 100 includes more, fewer, or different components than shown in FIGS. 1A and 1B. For example, the device 100 may include more transistors 120 or may include transistors having different configurations than shown in FIGS. 1A and 1B. It should be understood that more or fewer transistors may be included utilizing the principles described herein.

The dielectric structure 110 may be a component to hold or provide structural support for the transistors 120. The dielectric structure 110 may be formed or disposed above the substrate 150. The dielectric structure 110 may include non-conductive materials such as oxide. Within the dielectric structure 110, two or three dimensional arrays of transistors 120 can be formed. For example as shown in FIG. 1B, portions of transistors 120AA, 120BA, 120AC, 120BC, and transistors 120AB, 120BB can be arranged in a two dimensional array along the Z-direction and X-direction, within the dielectric structure 110. In some embodiments, additional transistors 120 can be stacked along the Y-direction to form a three dimensional array. In some embodiments, additional transistors 120 can be stacked along the Z-direction.

Each of the transistors 120 may include two or more dielectric nano sheets 140. Each dielectric nano sheet 140 may extend parallel to the substrate (e.g., along the X-direction and the Y-direction to form surfaces facing along the Z-direction). Each dielectric nano sheet 140 may include $SiO_2$. In one configuration, two dielectric nano sheets 140A, 140B are stacked along the Z-direction. The dielectric nano sheets 140 of the same transistor 120 may have the same dimensions (e.g., length along the X-direction or height along the Z-direction) to improve uniformity. In some implementations, the dielectric nano sheets 140 of the same transistor 120 may have different dimensions (e.g., dimension height).

Each of the transistors 120 may include channel regions 145. The channel regions 145 may be formed on surfaces of the dielectric nano sheets 140. Each channel region 145 may extend along the X-direction and the Y-direction to form surfaces facing along the Z-direction. Each channel region 145 may include 2D materials (e.g., $WS_2$, $WSe_2$, $WTe_2$, $MoS_2$, $MoSe_2$, $MoTe_2$, $HfS_2$, $ZrS_2$, $TiS_2$, $GaSe$, $InSe$, or phosphorene, etc.). The 2D materials may improve performances or characteristics of the transistors 120 (e.g., improved transconductance gm, improved gain bandwidth Ft, improved saturation current Idsat, etc.).

The techniques provided herein may additionally or alternatively utilize conductive dielectric materials (sometimes referred to herein as "conductive channels"), which may have similar properties to semiconductor materials, to fabricate the channel. For example, certain materials, when combined with oxygen, may form new materials that exhibit semiconductor properties (e.g., can turn "off" with low off-state leakage current or can become highly conductive under certain circumstances). Some examples of N-type conductive channels include $In_2O_3$, $SnO_2$, InGaZnO, and ZnO. One example of a P-type conductive channel is SnO.

The materials described herein may be deposited by an atomic layer deposition (ALD) process and may be 5-15 angstroms thick, the thinness lending to the name—2D material. Other deposition techniques may also be used, including but not limited to chemical vapor deposition (CVD), physical vapor deposition (PVD), and plasma-enhanced deposition techniques. The materials may be annealed during or after the device formation process to recrystallize or grow the crystals and thereby improve electrical characteristics.

Each of the transistors 120 may include gate dielectric regions 155. The gate dielectric regions 155 may be formed on surfaces of the channel regions 145. Each gate dielectric region 155 may extend along the X-direction and the Y-direction to form surfaces facing along the Z-direction. Each gate dielectric region 155 may include high-k dielectric material, such as $Si_3N_4$, $Al_2O_3$, $Ta_2O_5$, $TiO_2$, $ZrO_2$, and $HfO_2$. The high-k dielectric material may help improve characteristics of the transistor 120.

Each of the transistors 120 may include gate structure 165. The gate structures 165 may be formed on surfaces of the gate dielectric regions 155. Each gate structure 165 may extend along the X-direction and the Y-direction to form surfaces facing along the Z-direction. The gate structures 165 of a single one of the transistors 120 stacked along the Z-direction can be electrically coupled to each other through one or more metal rails or one or more via connections.

Each of the transistors 120 may also include source/drain structures 180A, 180B. The source/drain structure 180A may be coupled to left ends of the dielectric nano sheets 140A, 140B, and the source/drain structure 180B may be coupled to right ends of the dielectric nano sheets 140A, 140B. For example, the source/drain structure 180A includes a contact portion 184A directly coupled to the left end of the dielectric nano sheet 140A, a contact portion 186A directly coupled to the left end of the dielectric nano sheet 140B, and a bridge portion 182A extending along the Z-direction and coupled to the portions 184A, 186A. For example, the source/drain structure 180B includes a contact portion 184B directly coupled to the right end of the dielectric nano sheet 140A, a contact portion 186B directly coupled to the right end of the dielectric nano sheet 140B, and a bridge portion 182B extending along the Z-direction and coupled to the portions 184B, 186B.

Each of the transistors 120 may include two or more dielectric nano sheets 140 that may be configured as a GAA transistor. In one configuration, the channel regions 145 are formed on each dielectric nano sheet 140; the gate dielectric regions 155 are formed on surfaces of the channel regions 145 and not contacting the dielectric nano sheets 140; and the gate structures 165 are formed on surfaces of the gate dielectric regions 155 and not contacting the channel regions 145. Hence, each transistor 120 may have a set of gate structure 165, a gate dielectric region 155, a channel region 145, a dielectric nano sheet 140B, a channel region 145, a gate dielectric region 155, a gate structure 165, a gate dielectric region 155, a channel region 145, a dielectric nano sheet 140A, a channel region 145, a gate dielectric region 155, and a gate structure 165 stacked along the Z-direction in that sequence. By implementing a GAA transistor with two or more dielectric nano sheets 140 and channel regions 145 with 2D materials, a high performance transistor can be obtained in a compact form.

In one aspect, multiple transistors 120 may be stacked along the Z-direction to achieve area efficiency and simplify the fabrication process. For example, the transistor 120AB is disposed above the transistor 120BB along the Z-direction. In one example, source/drain structures 180A, 180B of the transistor 120AB are disposed above source/drain structures 180A, 180B of the transistor 120BB, respectively, along the Z-direction. In one example, gate structures 165, gate dielectric regions 155, channel regions 145, and dielectric nano sheets 140 of the transistor 120AB are disposed above gate structures 165, gate dielectric regions 155, channel regions 145, and dielectric nano sheets 140 of the transistor 120BB along the Z-direction. In one approach, source/drain structures 180A, 180B of transistors 120 stacked along the Z-direction can be formed by a single process. Similarly, gate structures 165 stacked along the Z-direction can be formed by a single process. In addition, gate dielectric regions 155 stacked along the Z-direction can be formed by a single process. Moreover, channel regions 145 stacked along the Z-direction can be formed by a single process. Furthermore, dielectric nano sheets 140 stacked along the Z-direction can be formed by a single process. Accordingly, multiple transistors 120 can be formed in an efficient manner.

In one aspect, a length of the gate structures 165, gate dielectric regions 155, channel regions 145, and dielectric nano sheets 140 of the transistor 120AB along the X-direction may be same as a length of the gate structures 165, gate dielectric regions 155, channel regions 145, and dielectric nano sheets 140 of the transistor 120BB along the X-direction, such that the transistors 120AB, 120BB can have a uniform structure. Alternatively, a length of the gate structures 165, gate dielectric regions 155, channel regions 145, and dielectric nano sheets 140 of the transistor 120AB along the X-direction may be different than a length of the gate structures 165, gate dielectric regions 155, channel regions 145, and dielectric nano sheets 140 of the transistor 120BB along the X-direction to allow a design flexibility.

The device 100 may include capping layers 190A, 190B, 190C on a top surface of the dielectric structure 110 to protect the transistors 120. Each capping layer 190 may be formed or disposed above two or more transistors 120 stacked along the Z-direction. In one configuration, each capping layer 190 is formed above a gate structure 165 and portions of source/drain structures 130A, 130B along the Z-direction to protect the transistors 120 formed underneath. In some embodiments, the capping layers 190A-190C may be omitted.

Some components of the transistors 120 are formed while the capping layers 190A-190C are formed or disposed on the top surface of the dielectric structure 110. In one configuration, the dielectric structure 110 may have trenches 195A, 195B, as depicted in white regions in FIG. 1A. Through the trenches 195A, 195B, spaces under the capping layers 190A-190C can be accessed by a fabrication tool (e.g., nozzle) to selectively form or remove one or more components to form the gate structures 165, gate dielectric regions 155, channel regions 145, and dielectric nano sheets 140, etc. Detailed descriptions on an example process of forming the transistors 120 are provided below with respect to FIGS. 2-17.

Figure 2:
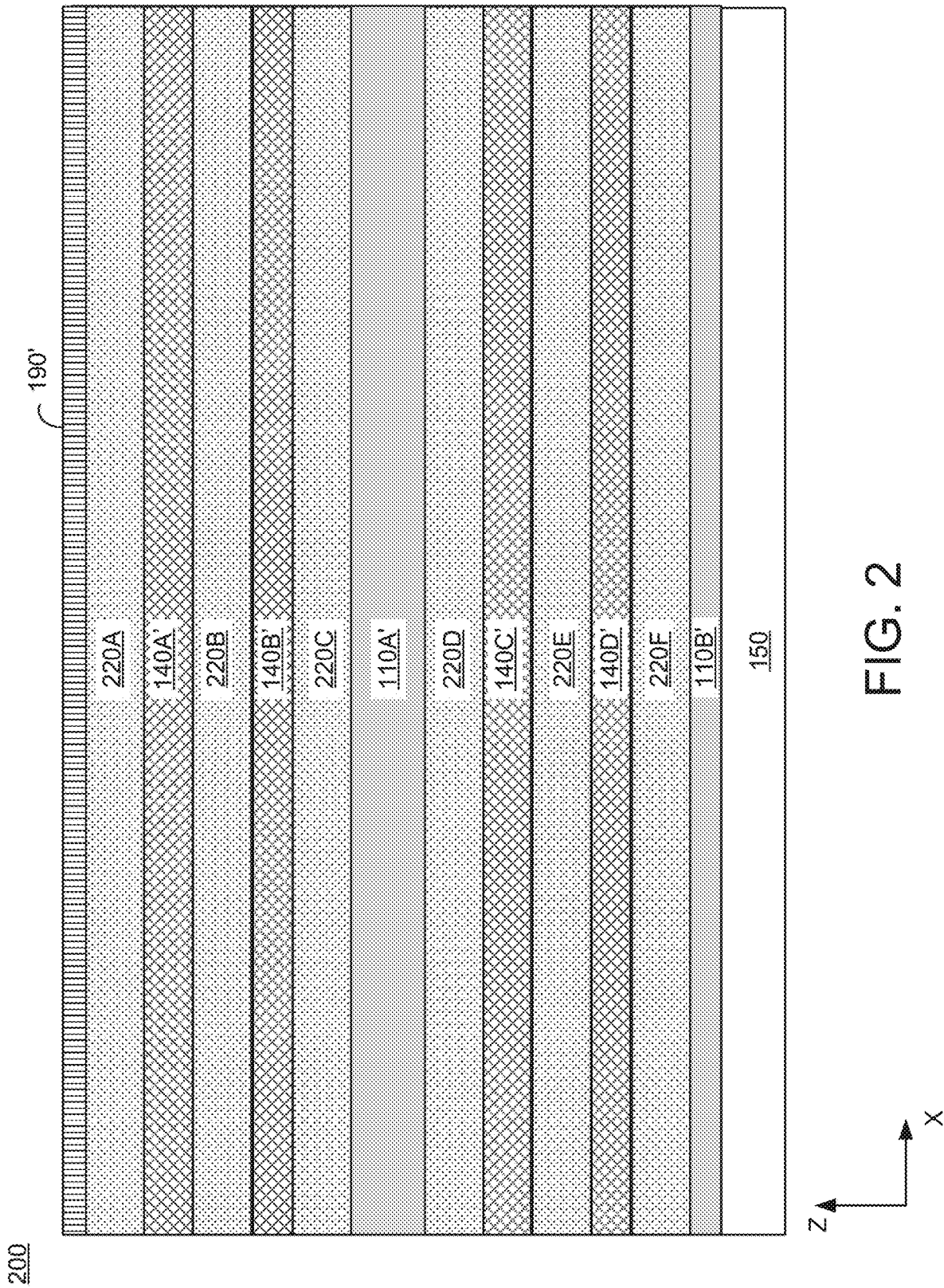
FIGS. 2-17 show top plan views and cross-sectional views of a process to the device including the stacked transistors, according to an embodiment.

FIGS. 2-17 top plan views and cross-sectional views of a process to form the device 100 including the stacked transistors 120, according to an embodiment. Each of FIGS. 2-17 generally refers to one or more process steps in a process flow, each of which is described in detail in connection with the respective Figure. For the purposes of simplicity and ease of visualization, some reference numbers may be omitted from some Figures. Referring to FIG. 2, illustrated is a cross-sectional view of the device 100 along I-I' in FIG. 1A, at the start 200 of the process flow. In one approach, a set of layers 150, 110B', 220F, 140D', 220E, 140C', 220D, 110A', 220C, 140B', 220B, 140A', 220A, and 190' can be formed. In one configuration, the layers 150, 110B', 220F, 140D', 220E, 140C', 220D, 110A', 220C, 140B', 220B, 140A', 220A, and 190' may be stacked along the Z-direction in that sequence. In one aspect, each of the layers 140A'-140D' is formed or disposed between corresponding two of the layers 220A-220F. The layers 150, 110B', 220F, 140D', 220E, 140C', 220D, 110A', 220C, 140B', 220B, 140A', 220A, and 190' may be formed by a series of deposition processes. The deposition of the layers 150, 110B', 220F, 140D', 220E, 140C', 220D, 110A', 220C, 140B', 220B, 140A', 220A, and 190' can be performed using any type of deposition technique, including but not limited to ALD, chemical vapor deposition (CVD), and physical vapor deposition (PVD).

The substrate 150 may be a structure, on which a dielectric structure 110 can be formed. The substrate 150 may include non-conductive materials. For example, the substrate 150 may include non-Si based material.

The dielectric layers 110A', 110B' are initial layers for forming the dielectric structure 110. The dielectric layers 110A', 110B' may include the same material (e.g., oxide) as the dielectric structure 110. The dielectric layer 110B' may be formed on or above the substrate 150 along the Z-direction, where the dielectric layer 110A' may be formed on or above the dielectric layer 220D along the Z-direction.

The dielectric nano sheets 140A'-140D' are initial layers or initial nano sheets to form the dielectric nano sheets 140A, 140B of the transistors 120AB, 120BB in FIG. 1B. The dielectric nano sheets 140A'-140D' may include the same material (e.g., $SiO_2$) as the dielectric nano sheets 140A, 140B in FIG. 1B. The dielectric nano sheet 140D' may be formed on or above the dielectric layer 220F along the Z-direction. The dielectric nano sheet 140C' may be formed on or above the dielectric layer 220E along the Z-direction. The dielectric nano sheet 140B' may be formed on or above the dielectric layer 220C along the Z-direction. The dielectric nano sheet 140A' may be formed on or above the dielectric layer 220B along the Z-direction.

The dielectric layers 220A-220F are layers for temporarily providing structural support for the layers 140A'-140D'. The dielectric layers 220A-220F may be removed, and various components for forming transistors 120 can be formed in a space, at which the dielectric layers 220A-220F are removed, as described below. The dielectric layer 220F may be formed on or above the dielectric layer 110B' along the Z-direction. The dielectric layer 220E may be formed on or above the dielectric nano sheet 140D' along the Z-direction. The dielectric layer 220D may be formed on or above the dielectric nano sheet 140C' along the Z-direction. The dielectric layer 220C may be formed on or above the dielectric layer 110A' along the Z-direction. The dielectric layer 220B may be formed on or above the dielectric nano sheet 140B' along the Z-direction. The dielectric layer 220A may be formed on or above the dielectric nano sheet 140A' along the Z-direction.

The capping layer 190' may be an initial capping layer to obtain the capping layer 190 of FIG. 1B. The capping layer 190' may include the same material as the capping layer 190. The capping layer 190' may be formed on or above the dielectric layer 220A along the Z-direction.

Figure 3:
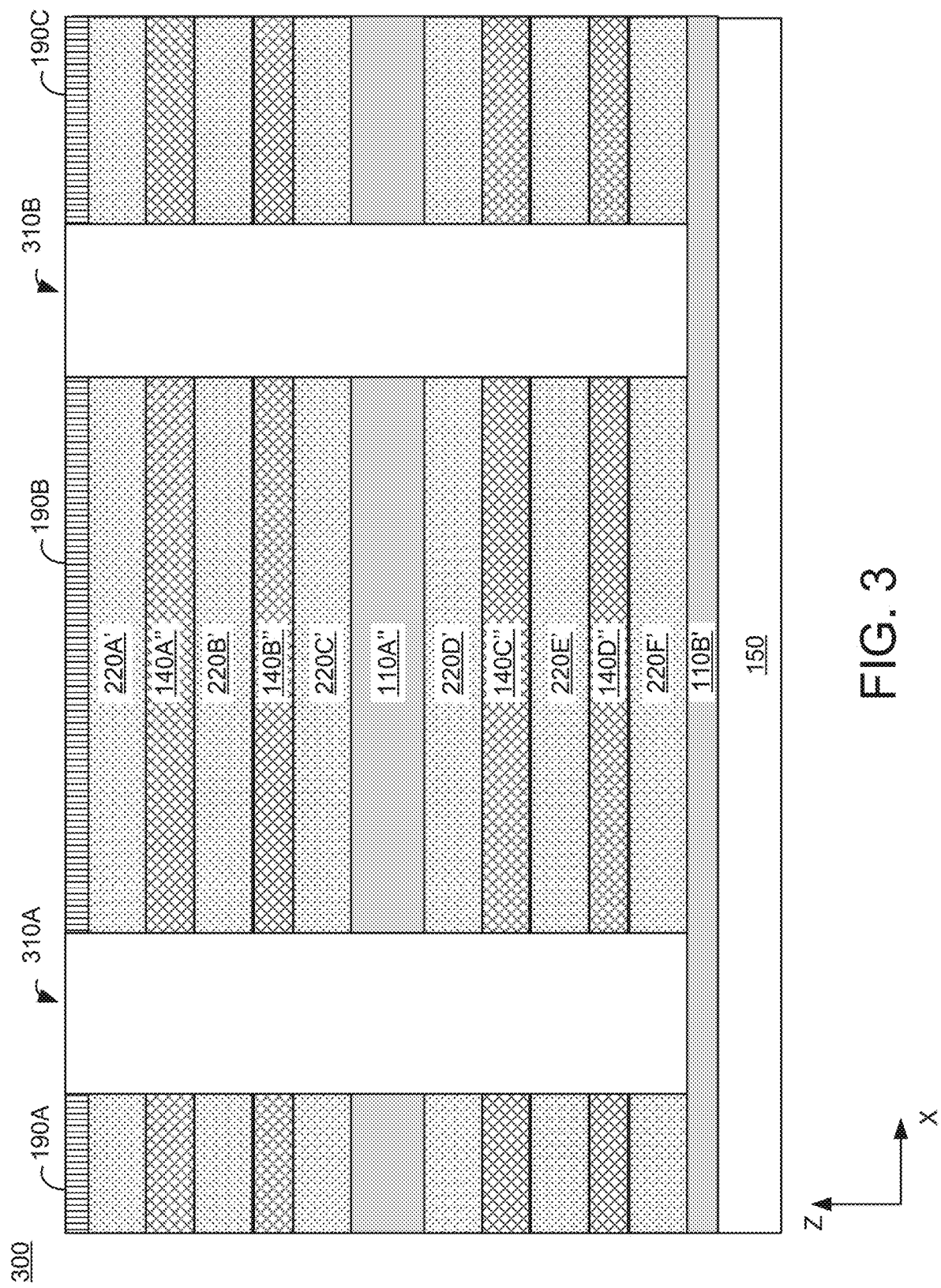

Referring to FIG. 3, illustrated is a cross-sectional view of the device 100 along I-I' in FIG. 1A, in the next stage 300 of the process flow. As shown, in this stage 300 in the process flow, vertical portions of the layers 220F, 140D', 220E, 140C', 220D, 110A', 220C, 140B', 220B, 140A', 220A, and 190' along the Z-direction are removed to form trenches 310A, 310B. Edges of the remaining portions of the layers 220F, 140D', 220E, 140C', 220D, 110A', 220C, 140B', 220B, 140A', 220A, and 190' may be aligned and form a flushed surface facing along the X-direction (or horizontal direction). The flushed surfaces facing along the X-direction may constitute sidewalls of the trenches 310A, 310B. In one approach, the vertical portions of the layers 220F, 140D', 220E, 140C', 220D, 110A', 220C, 140B', 220B, 140A', 220A, and 190' may be removed by etching. Examples of etching may include dry etching, wet etching, plasma etching, reactive ion etching (ME) or any etching. The vertical portions of the layers 220F, 140D', 220E, 140C', 220D, 110A', 220C, 140B', 220B, 140A', 220A, and 190' may be removed by a single etching process, or a series of etching processes. By removing the vertical portions of the layers, unit layers 220F', 140D", 220E', 140C", 220D', 110A", 220C', 140B", 220B', 140A", and 220A" each having the same length along the X-direction can be formed. Moreover, by removing the vertical portions of the layers, the capping layers 190A, 190B, 190C can be obtained or formed.

Figure 4:
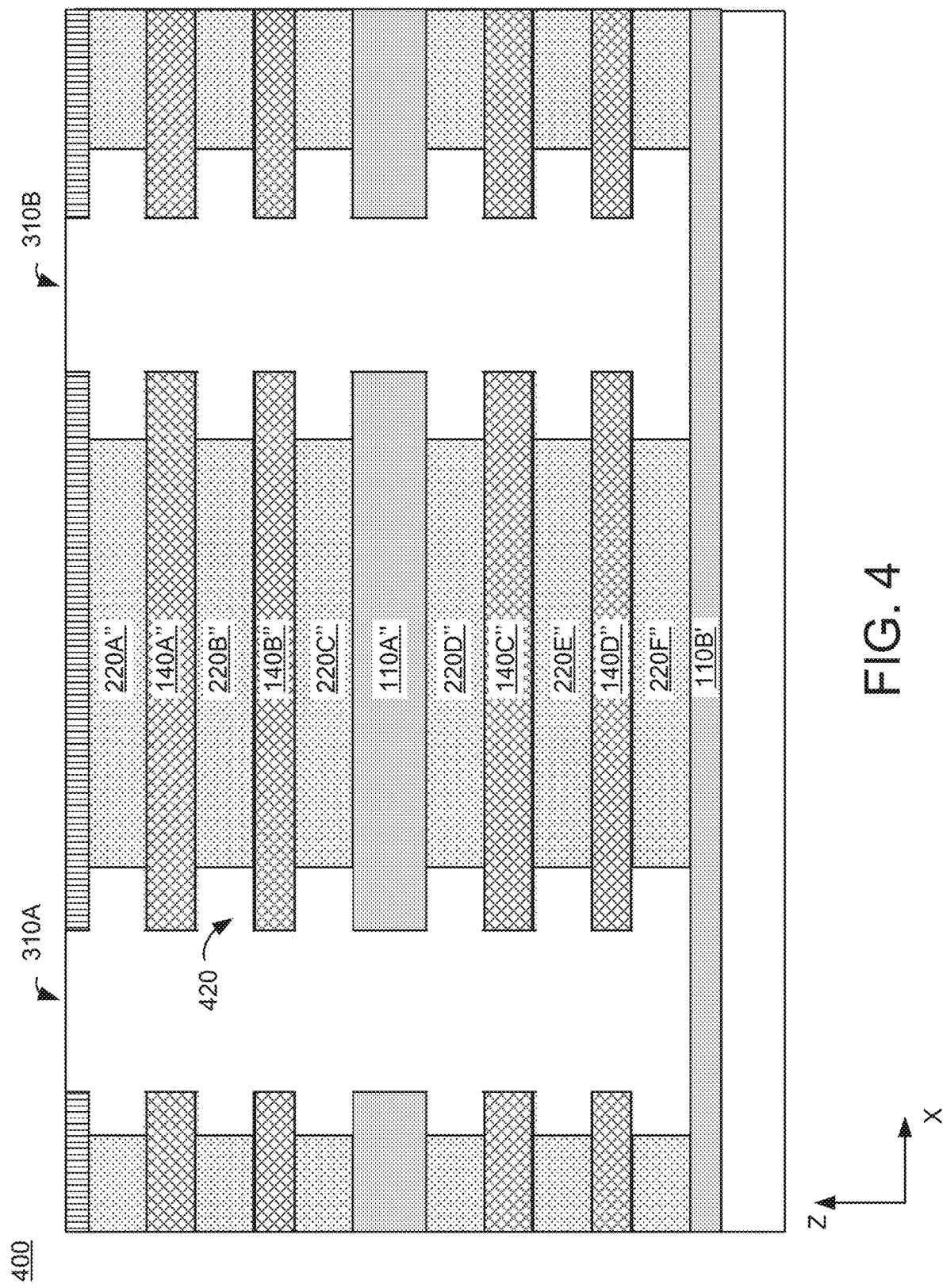

Referring to FIG. 4, illustrated is a cross-sectional view of the device 100 along I-I' in FIG. 1A, in the next stage 400 of the process flow. As shown, in this stage 400 in the process flow, end portions of the unit dielectric layers 220A'-220F' can be removed to obtain or form dielectric layers 220A"-220F" each having a smaller length along the X-direction compared to the unit dielectric layers 220A'-220F'. The end portions of the unit dielectric layers 220A'-220F' may be removed by etching. Examples of etching may include dry etching, wet etching, plasma etching, RIE or any etching. By removing the end portions of the unit dielectric layers 220A'-220F', indents 420 can be formed on the sidewalls of the trenches 310A, 310B.

Figure 5:
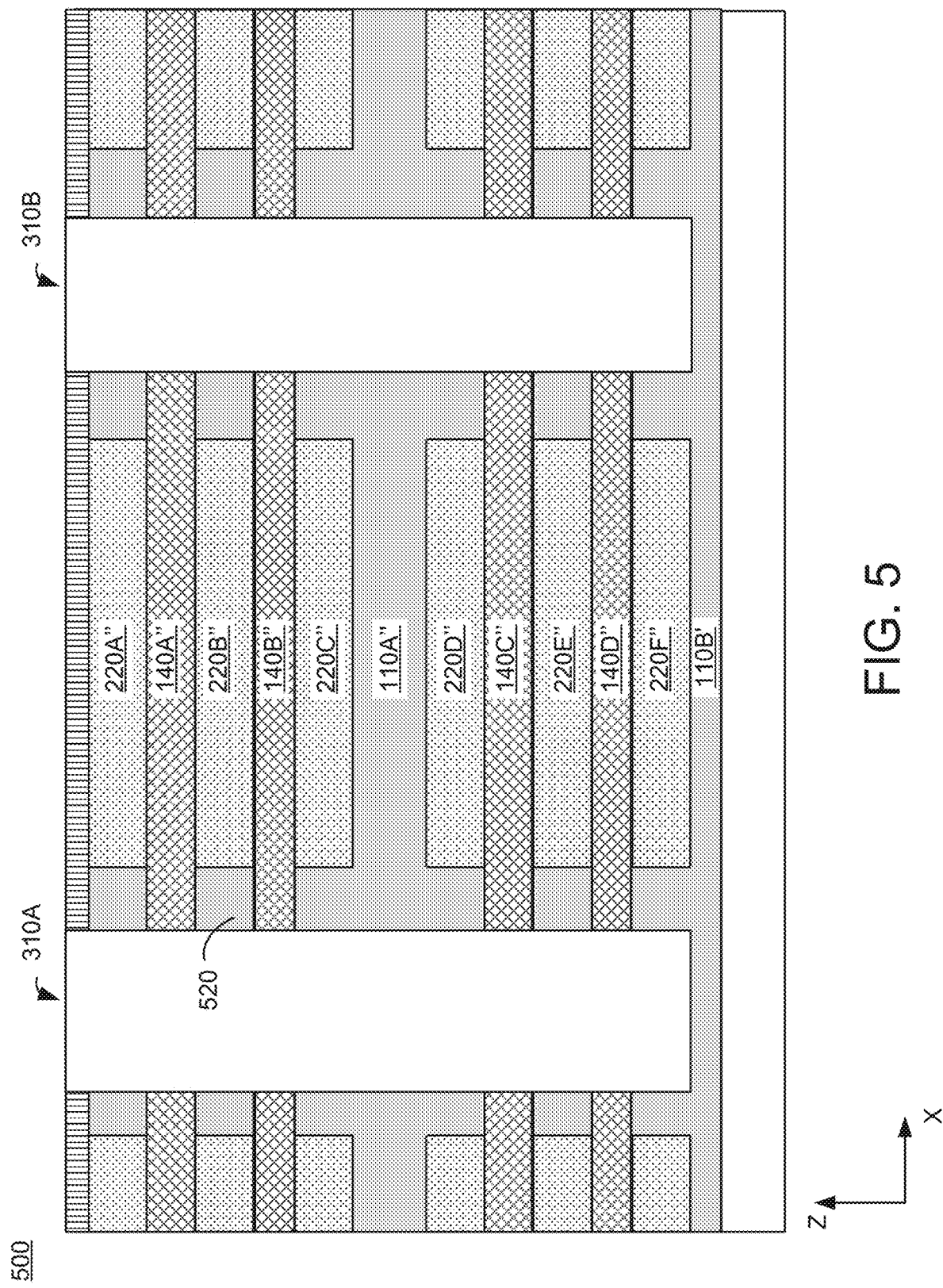

Referring to FIG. 5, illustrated is a cross-sectional view of the device 100 along I-I' in FIG. 1A, in the next stage 500 of the process flow. As shown, in this stage 500 in the process flow, dielectric structures 520 may be formed in indents 420 corresponding to the removed portions in FIG. 4. The dielectric structures 520 may include the same materials (e.g., oxide) as the dielectric layers 110A', 110B'. The dielectric structures 520 may be formed by a deposition process. The deposition of the dielectric structures 520 can be performed using any type of deposition technique, including but not limited to ALD, CVD, and PVD. In some cases, etching can be performed to remove remnants or portions of the dielectric structures 520 out of the indents 420, such that the sidewalls of the trenches 310A, 310B can have flushed surfaces facing along the X-direction.

Figure 6:
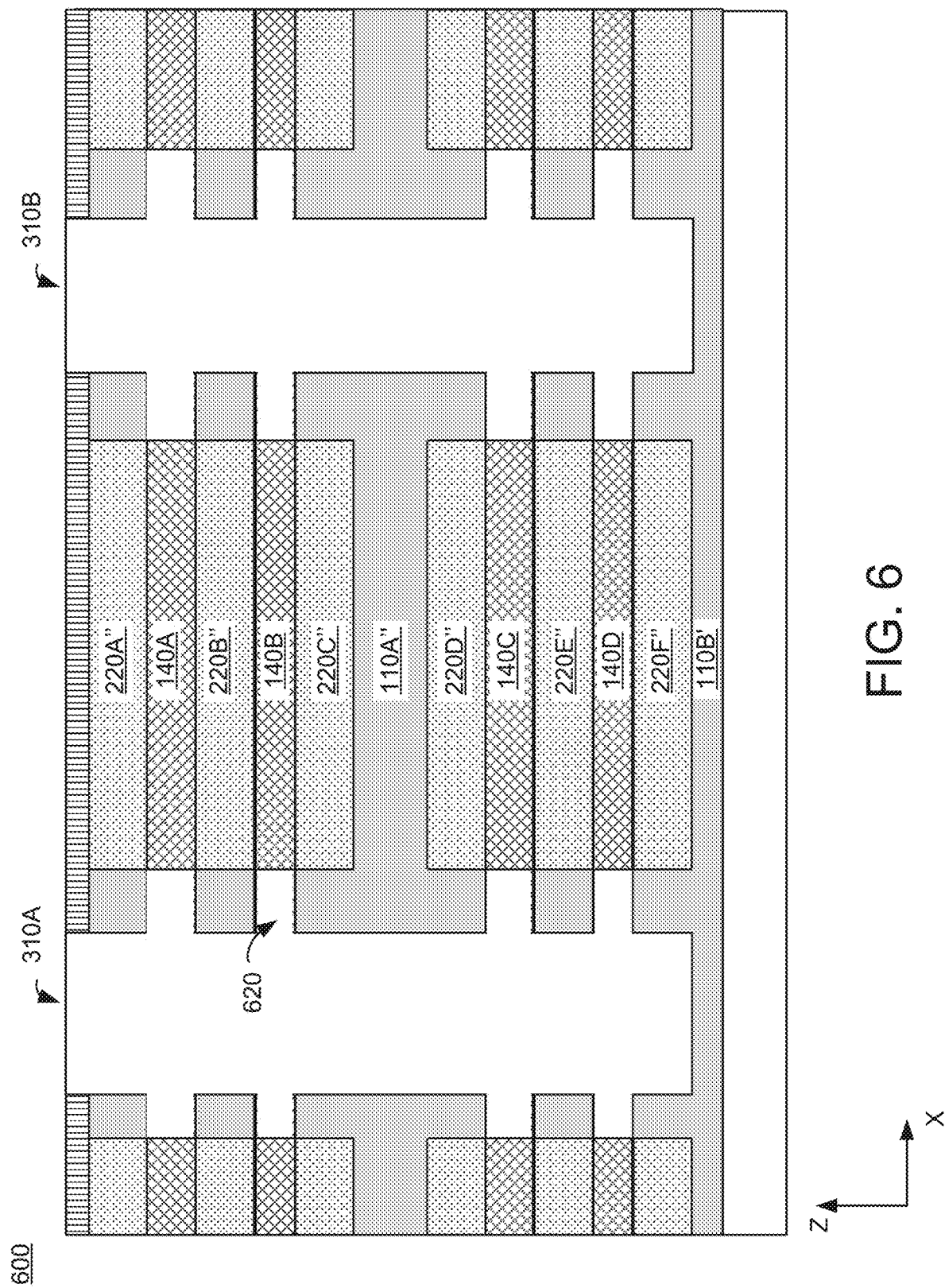

Referring to FIG. 6, illustrated is a cross-sectional view of the device 100 along I-I' in FIG. 1A, in the next stage 600 of the process flow. As shown, in this stage 600 in the process flow, end portions of the unit dielectric nano sheets 140A"-140D" can be removed to obtain or form dielectric nano sheets 140A-140D each having a smaller length along the X-direction compared to the unit dielectric nano sheets 140A"-140D". The end portions of the unit dielectric nano sheets 140A"-140D" may be removed by etching. Examples of etching may include dry etching, wet etching, plasma etching, RIE or any etching. By removing the end portions of the unit dielectric nano sheets 140A"-140D", indents 620 can be formed on the sidewalls of the trenches 310A, 310B.

Figure 7:
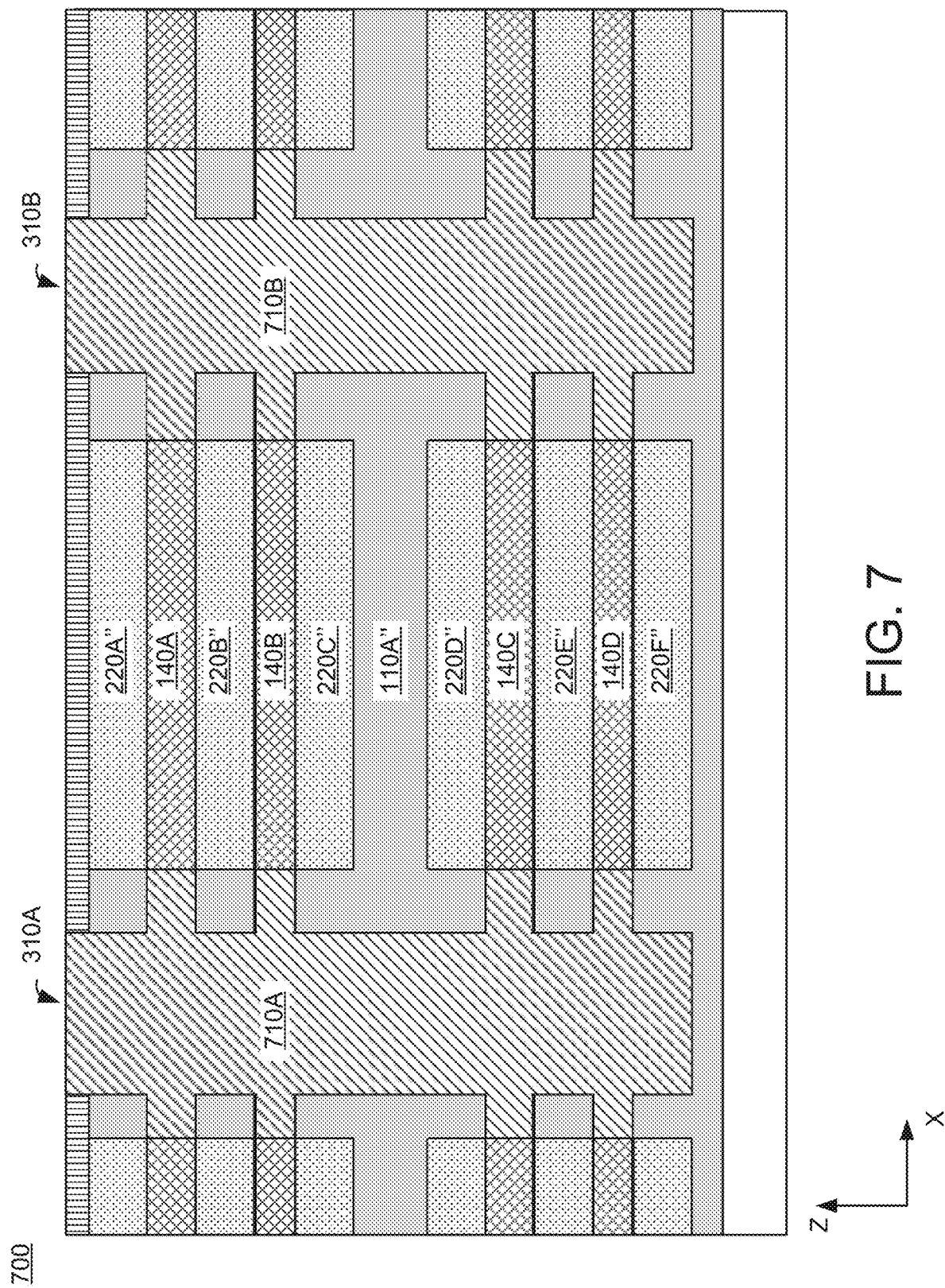

Referring to FIG. 7, illustrated is a cross-sectional view of the device 100 along I-I' in FIG. 1A, in the next stage 700 of the process flow. As shown, in this stage 700 in the process flow, metal structures 710A, 710B can be formed in the trenches 310A, 310B. The metal structures 710A, 710B may include metal or conductive materials. The metal structures 710A, 710B may include the same materials as the source/drain structures 180. The metal structures 710A, 710B may be formed by a deposition process. The deposition of the metal structures 710A, 710B can be performed using any type of deposition technique, including but not limited to ALD, CVD, and PVD. By forming the metal structures 710A, 710B, the indents 620 can be filled, such that the metal structures 710A, 710B can directly contact ends of the dielectric nano sheets 140A-140D.

Figure 8:
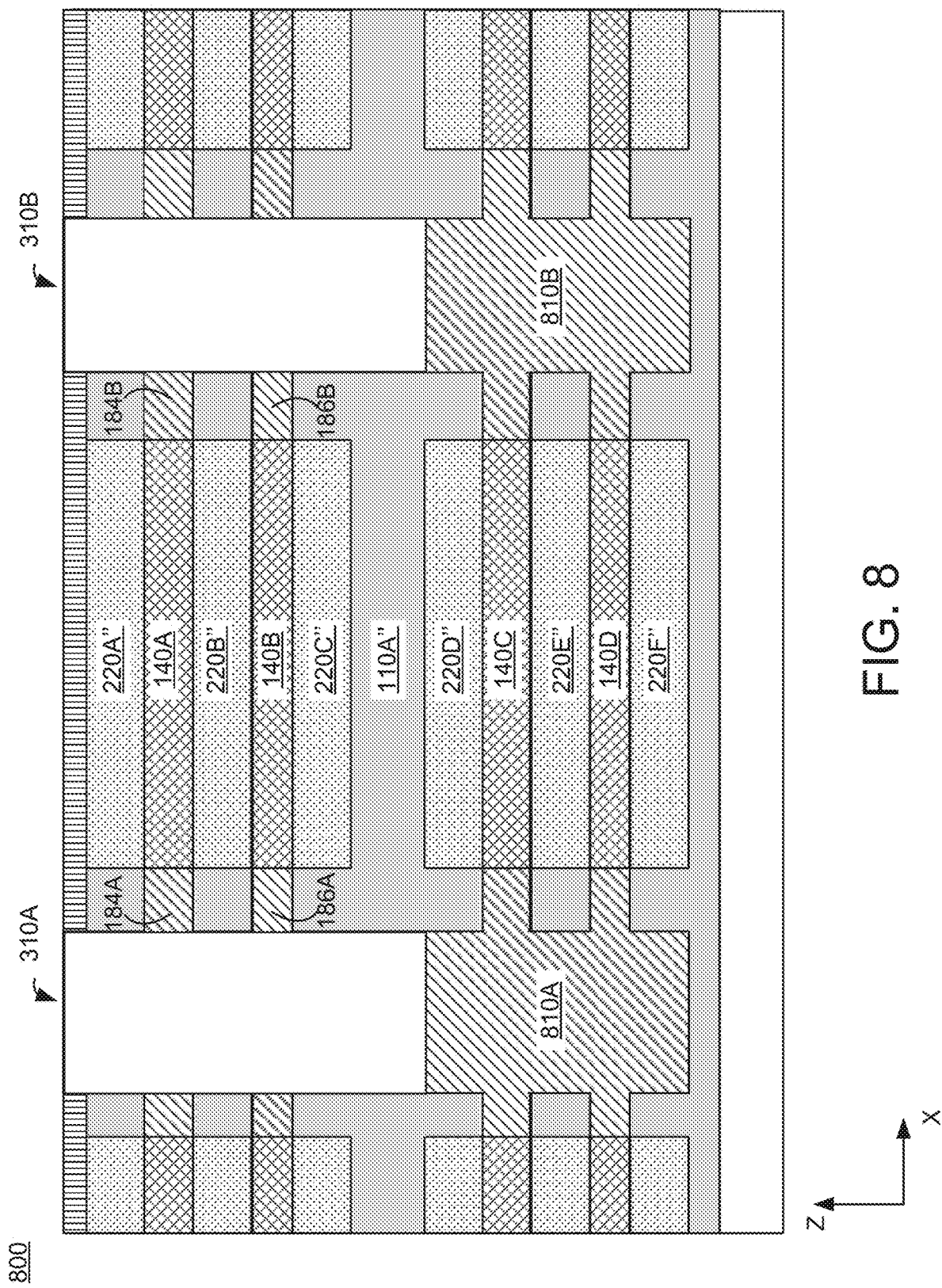

Referring to FIG. 8, illustrated is a cross-sectional view of the device 100 along I-I' in FIG. 1A, in the next stage 800 of the process flow. As shown, in this stage 800 in the process flow, top portions of the metal structures 710A, 710B in the trenches 310A, 310B can be removed to obtain or form the metal structures 810A, 810B corresponding to the bottom portions (or remaining portions) of the metal structures 710A, 710B. The metal structures 810A, 810B may have a height along the Z-direction that is same as or corresponds to a height of the stack of layers 220D"-220F" and 140C, 140D along the Z-direction. The top portions of the metal structures 710A, 710B may be removed by etching. Examples of etching may include dry etching, wet etching, plasma etching, RIE or any etching. By removing the top portions of the metal structures 710A, 710B, portions of the metal structures 710A, 710B may remain in the indents 620 adjacent to dielectric nano sheets 140A, 140B to form contact portions 184A, 186A, 184B, 186B of the source/drain structures for the transistor 120AB.

Figure 9:
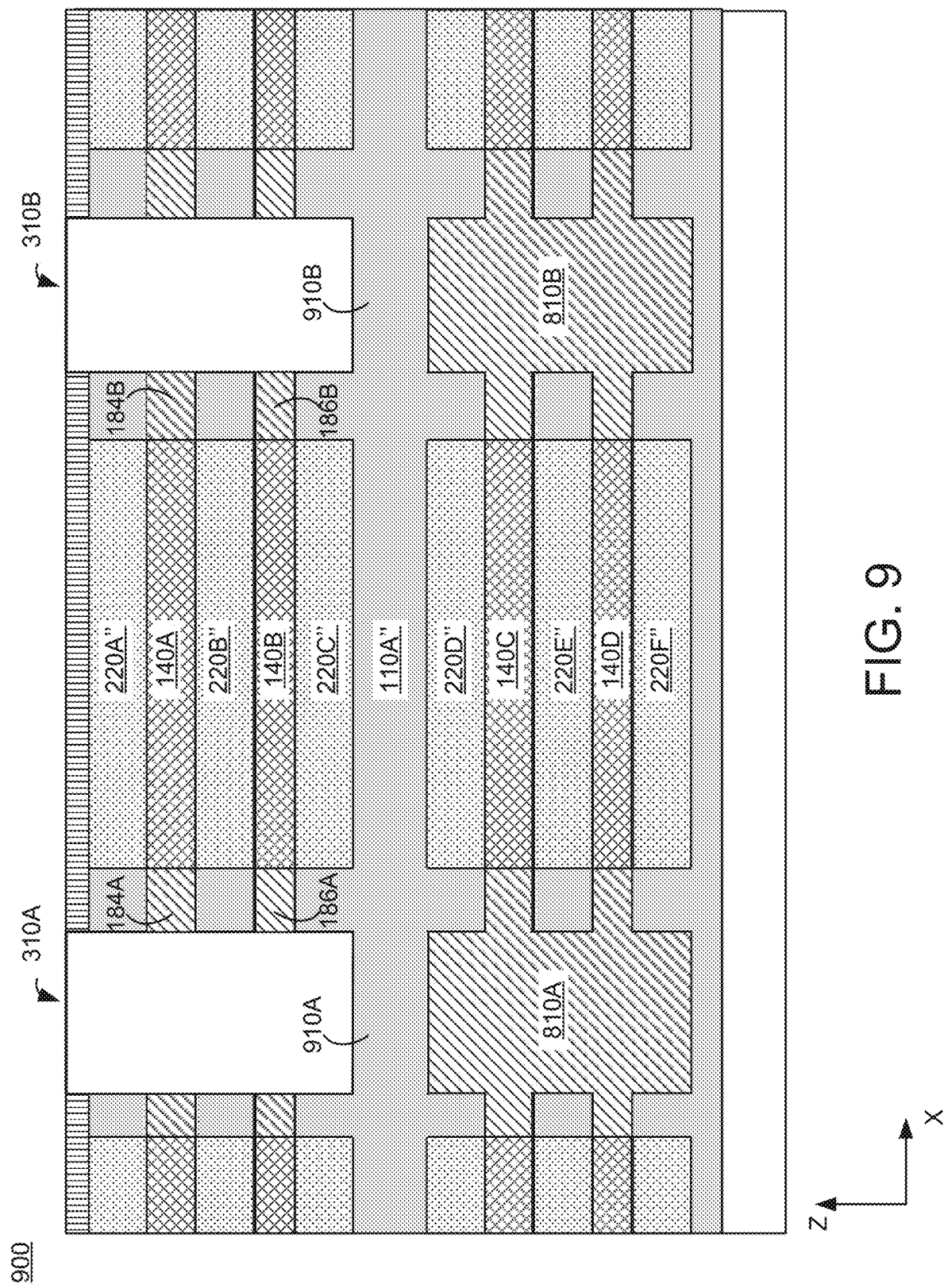

Referring to FIG. 9, illustrated is a cross-sectional view of the device 100 along I-I' in FIG. 1A, in the next stage 900 of the process flow. As shown, in this stage 900 in the process flow, dielectric structures 910A, 910B can be formed in the trenches 310A, 310B. The dielectric structures 910A, 910B may include the same material as the dielectric layer 110A". The dielectric structures 910A, 910B may be formed, such that top surfaces of the dielectric structures 910A, 910B may be on the same level as the bottom surface of the dielectric layer 220C". The dielectric structures 910A, 910B may be formed by a deposition process. The deposition of the dielectric structures 910A, 910B can be performed using any type of deposition technique, including but not limited to ALD, CVD, and PVD. In one aspect, the dielectric structures 910A, 910B can operate as insulators or dividers that can electrically separate or isolate the source/drain structures 180 of the transistor 120BB from the source/drain structures 180 of the transistor 120AB. In some cases, a chemical mechanical polishing (CMP) process may be performed such that top surfaces of the dielectric structures 910A, 910B can be polished.

Figure 10:
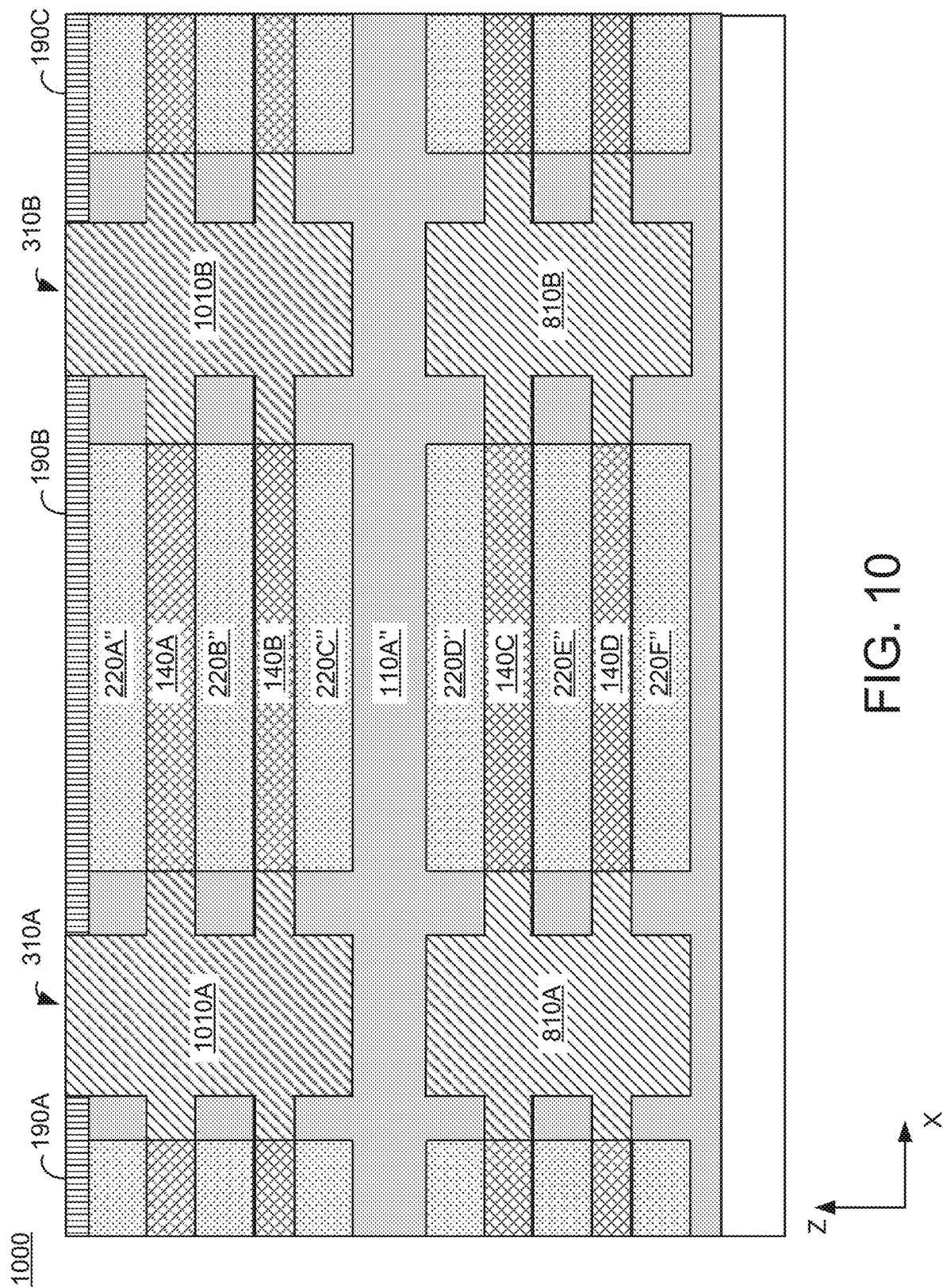

Referring to FIG. 10, illustrated is a cross-sectional view of the device 100 along I-I' in FIG. 1A, in the next stage 1000 of the process flow. As shown, in this stage 1000 in the process flow, metal structures 1010A, 1010B can be formed in the remaining portions of the trenches 310A, 310B. The metal structures 1010A, 1010B may include the same materials as the source/drain structures 180. The metal structures 1010A, 1010B may be formed by a deposition process. The deposition of the metal structures 1010A, 1010B can be performed using any type of deposition technique, including but not limited to ALD, CVD, and PVD. In some cases, a CMP process may be performed such that top surfaces of the metal structures 1010A, 1010B and the capping layers 190A, 190B, 190C can form a flushed surface.

Figure 11:
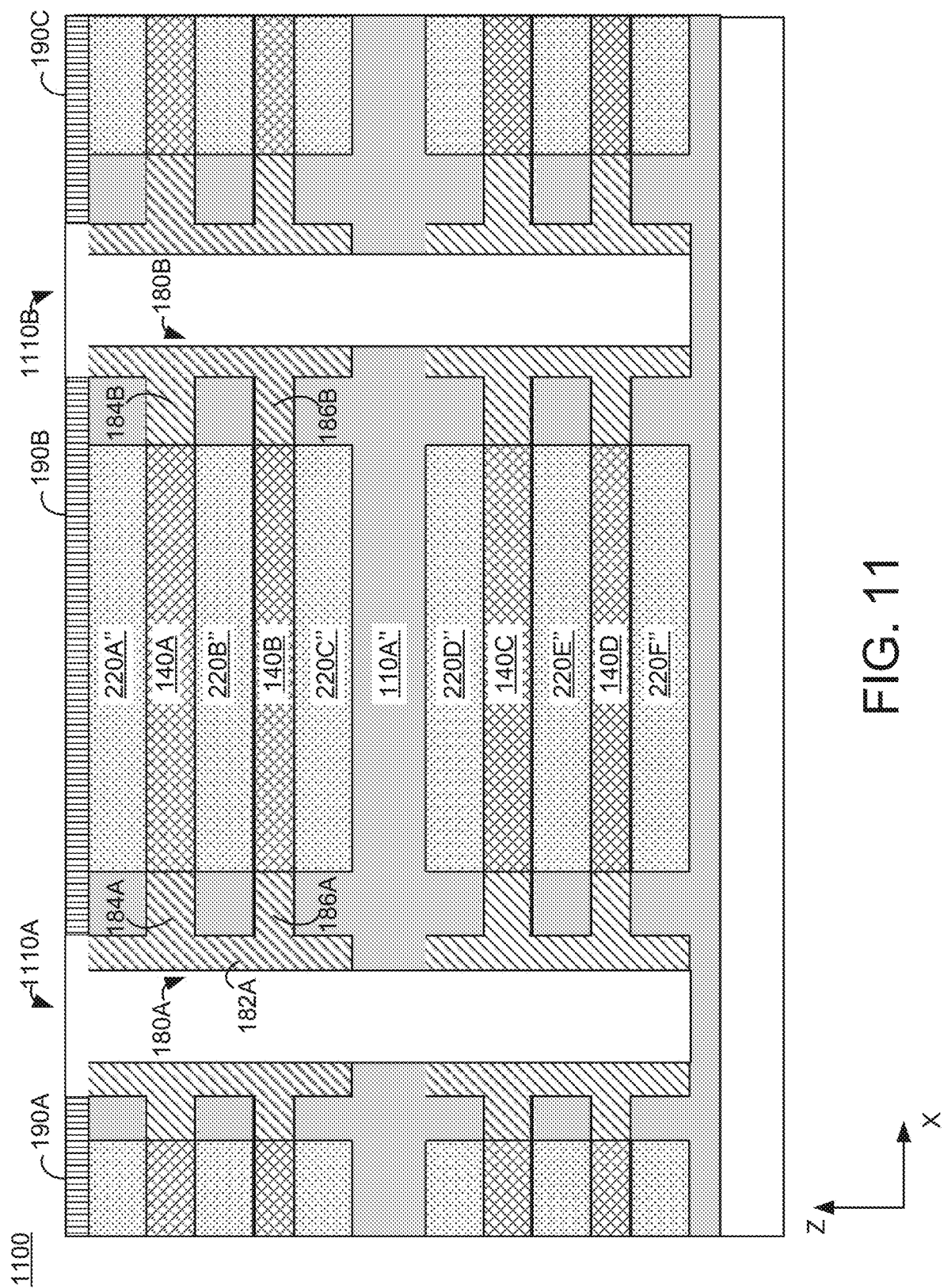

Referring to FIG. 11, illustrated is a cross-sectional view of the device 100 along I-I' in FIG. 1A, in the next stage 1100 of the process flow. As shown, in this stage 1100 in the process flow, vertical portions of the metal structures 810A, 810B, 1010A, 1010B, and dielectric structures 910A, 910B along the Z-direction are removed to form trenches 1110A, 1110B. In one approach, the vertical portions of the metal structures 810A, 810B, 1010A, 1010B, and dielectric structures 910A, 910B may be removed by etching. Top edge portions of the metal structures 1010A, 1010B adjacent to the capping layers 190A, 190B, 190C along the X-direction may be removed as well. Examples of etching may include dry etching, wet etching, plasma etching, RIE or any etching. The vertical portions of the metal structures 810A, 810B, 1010A, 1010B, and dielectric structures 910A, 910B may be removed by a single etching process, or a series of etching processes. The length of the trenches 1110A, 1110B along the X-direction may be less than a length of the metal structures 810A, 810B, 1010A, 1010B along the X-direction, such that source/drain structures 180 of transistors 120A, 120B can be formed by removing the vertical portions of the metal structures 810A, 810B, 1010A, 1010B, and dielectric structures 910A, 910B. For example, the source/drain structure 180A may include contact portions 184A, 186A directly contacting ends of the dielectric nano sheets 140A, 140B, and a bridge portion 182A extending along the Z-direction and coupled to the contact portions 184A, 186A. Similarly, the source/drain structure 180B may include contact portions 184B, 186B directly contacting ends of the dielectric nano sheets 140A, 140B, and a bridge portion 182B extending along the Z-direction and coupled to the contact portions 184B, 186B.

Figure 12:
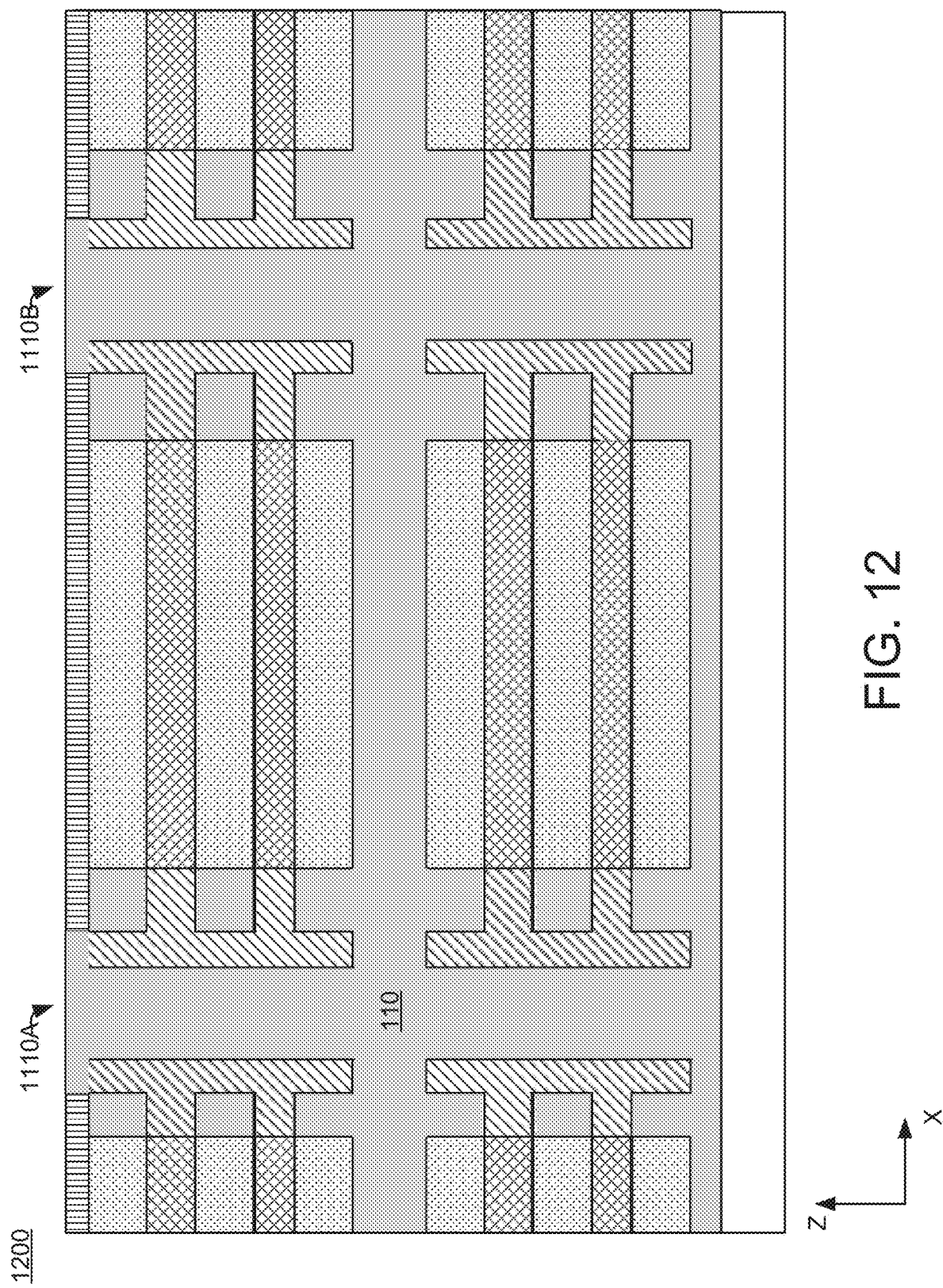

Referring to FIG. 12, illustrated is a cross-sectional view of the device 100 along I-I' in FIG. 1A, in the next stage 1200 of the process flow. As shown, in this stage 1200 in the process flow, dielectric structures can be formed in the trenches 1110A, 1110B. The dielectric structures may include the same material (e.g., oxide) as the dielectric layer 110A". The dielectric structures can be formed to fill the trenches 1110A, 1110B to obtain the dielectric structure 110. The dielectric structures may be formed by a deposition process. The deposition of the dielectric structures can be performed using any type of deposition technique, including but not limited to ALD, CVD, and PVD. In one aspect, the dielectric structure 110 can operate as an insulator or a divider that can electrically separate or isolate different transistors 120. In some cases, a CMP process may be performed such that top surfaces of the dielectric structure 110 in the trenches 1110A, 1110B and the capping layers 190A, 190B, 190C can form a flushed surface.

Figure 13:
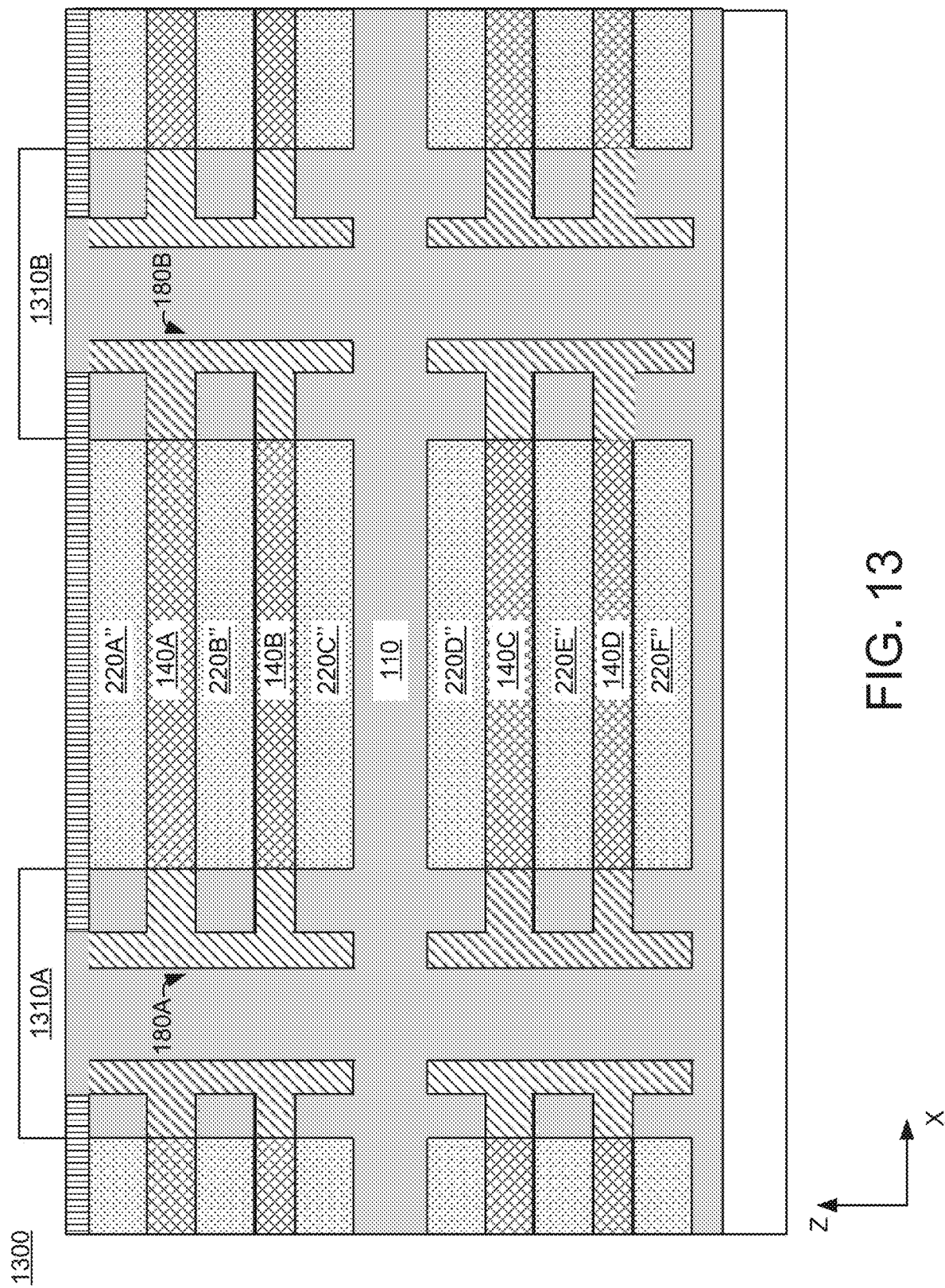

Referring to FIG. 13, illustrated is a cross-sectional view of the device 100 along I-I' in FIG. 1A, in the next stage 1300 of the process flow. As shown, in this stage 1300 in the process flow, photoresist masks 1310A, 1310B can be placed on the top surface of the device 100. The photoresist masks 1310A, 1310B may protect or cover the source/drain structures 180 along the Z-direction. The photoresist masks 1310A, 1310B may have openings that expose the dielectric nano sheets 140A-140D and dielectric layers 220A"-220F" along the Z-direction.

Figure 14:
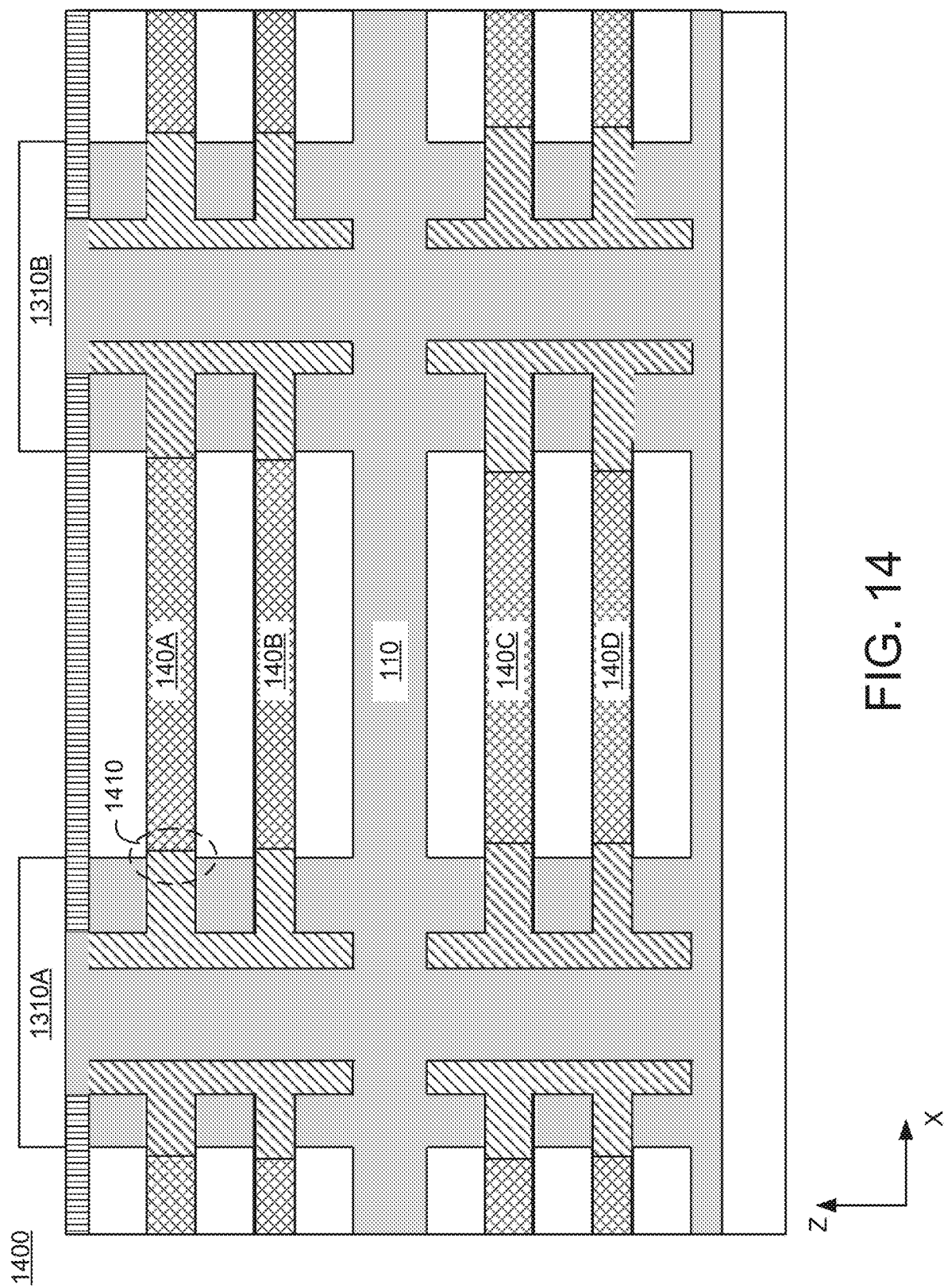

Referring to FIG. 14, illustrated is a cross-sectional view of the device 100 along I-I' in FIG. 1A, in the next stage 1400 of the process flow. As shown, in this stage 1400 in the process flow, dielectric layers 220A"-220F" are removed. The dielectric layers 220A"-220F" may be removed by etching through openings of the photoresist masks 1310A, 1310B. The examples of etching may include dry etching, wet etching, plasma etching, RIE or any etching. Etching may be performed with materials or a process reactive to the dielectric layers 220A"-220F", but not reactive to the dielectric nano sheets 140A-140D, such that the dielectric layers 220A"-220F" can be removed while the dielectric nano sheets 140A-140D may remain unremoved. The photoresist masks 1310A, 1310B may protect the source/drain structures 180 along the Z-direction. In one embodiment, removal of the dielectric layers 220A"-220F" does not expose the metal or source/drain structures 180. In another embodiment, as shown in FIG. 14, the structure can be configured such that portions 1410 of metal or source/drain structures 180 protruding along the X-direction may be revealed by removing the dielectric layers 220A"-220F" (in the event that the dielectric nano sheets 140A-140D are not aligned with the dielectric structure 110). The metal may be used as a seed for 2D material.

Figure 15:
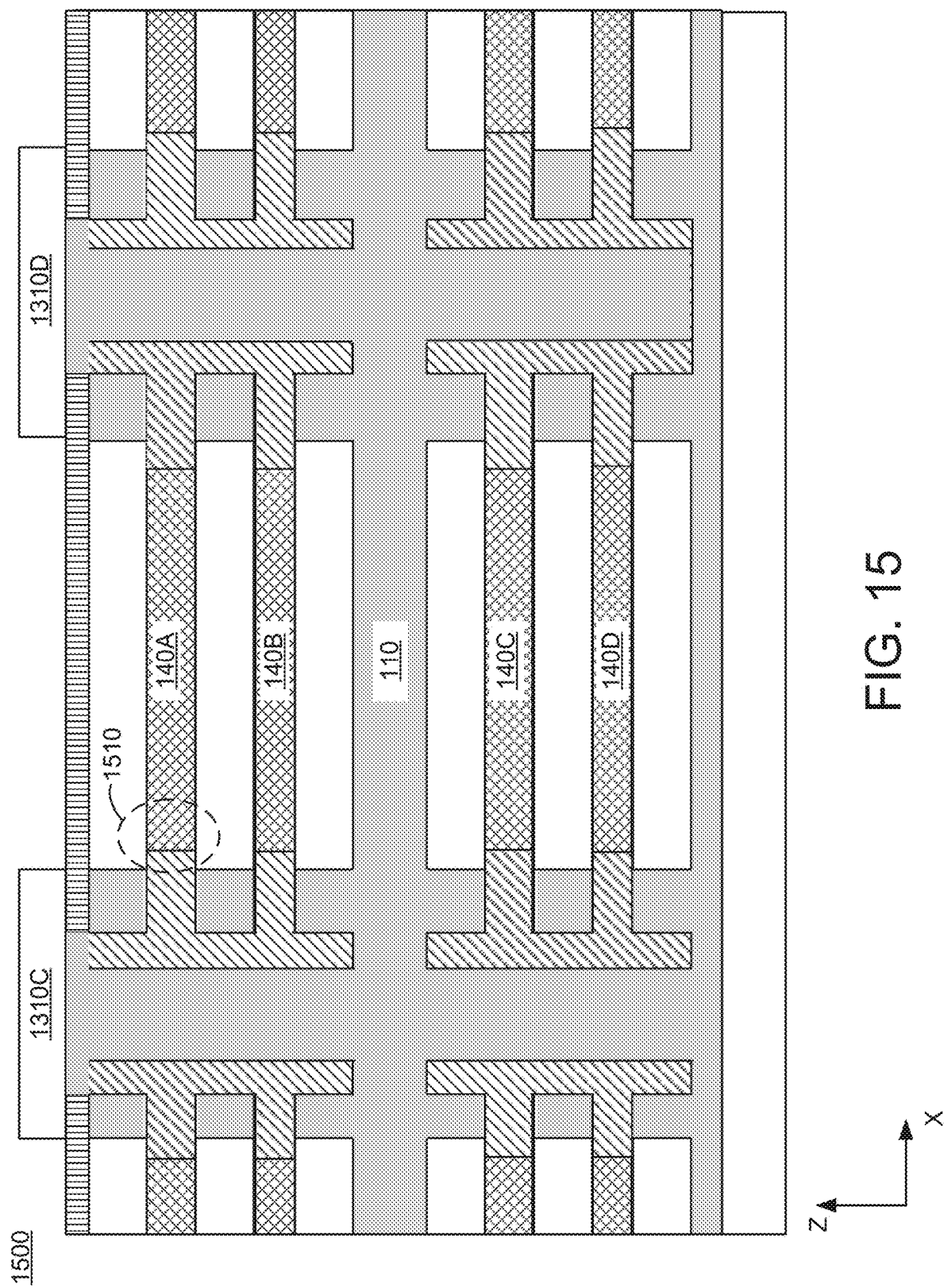

Referring to FIG. 15, illustrated is a cross-sectional view of the device 100 along I-I' in FIG. 1A, in the next stage 1500 of the process flow. As shown, in this stage 1500 in the process flow, a portion of the dielectric structure 110 may be removed (e.g., etched) to expose or increase exposure of portions 1510 of metal or source/drain structures 180 adjacent to the dielectric nano sheets 140A-140D. In one example, the photoresist masks 1310A, 1310B can be replaced with photoresist masks 1310C, 1310D having narrower widths along the X-direction, and etching of the dielectric structure 110 can be performed with the photoresist masks 1310C, 1310D. The examples of etching may include dry etching, wet etching, plasma etching, RIE or any etching. The dielectric nano sheets 140A-140D may be a seed for 2D material.

Figure 16:
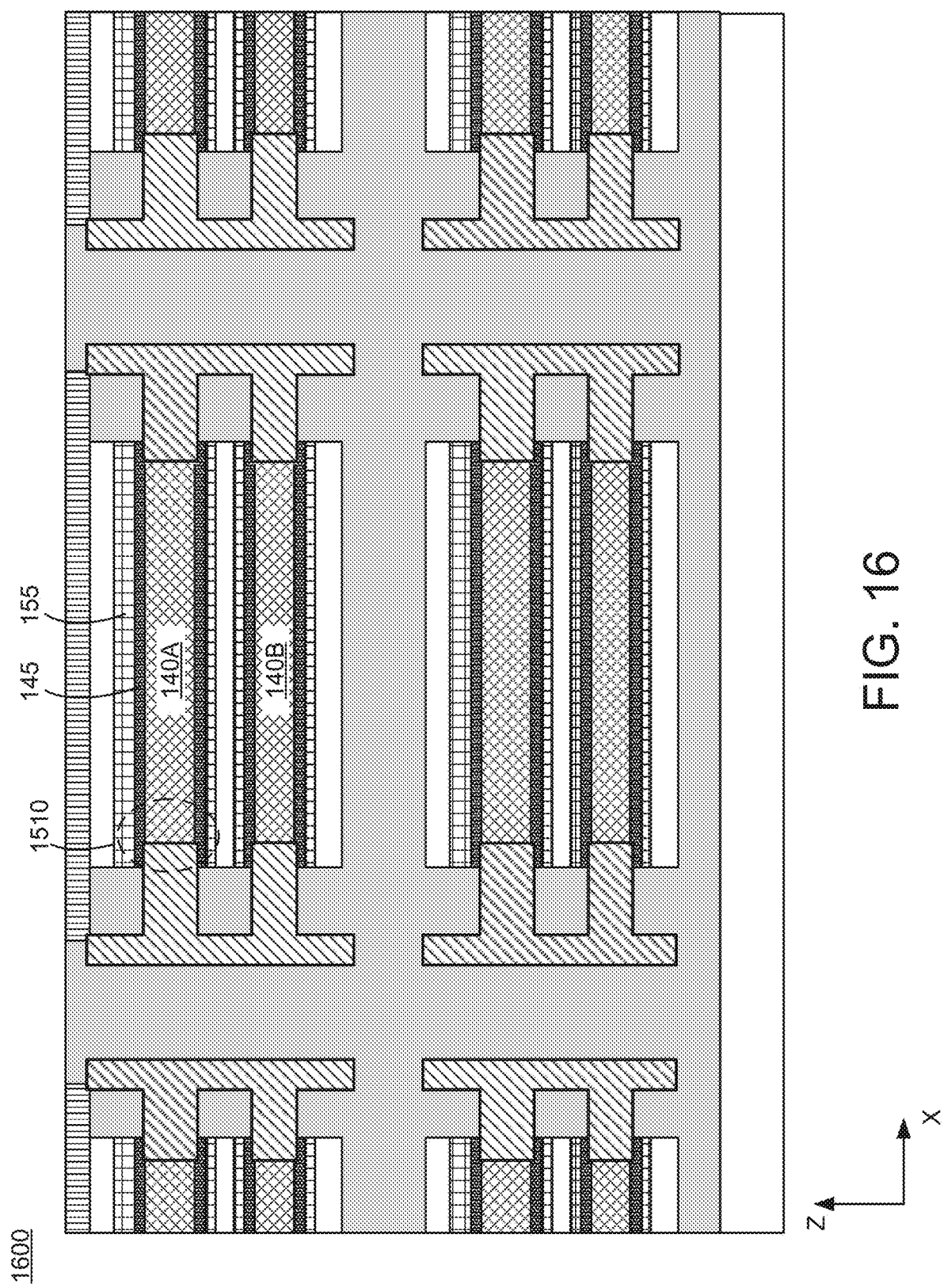

Referring to FIG. 16, illustrated is a cross-sectional view of the device 100 along I-I' in FIG. 1A, in the next stage 1600 of the process flow. As shown, in this stage 1600 in the process flow, photoresist masks 1310A, 1310B are removed, and channel regions 145 and gate dielectric regions 155 are formed. The photoresist mask 1310A, 1310B of FIG. 13 can be removed by a suitable stripping technique (e.g., by applying a chemical reactive to the photoresist mask 1310 and relatively unreactive to the dielectric structure 110 and the capping layers 190). The channel regions 145 may be formed on surfaces (e.g., top surfaces and bottom surfaces) of the dielectric nano sheets 140 facing along the Z-direction. Each channel region 145 may extend along the X-direction and the Y-direction to form surfaces facing along the Z-direction. Each channel region 145 may include 2D materials (e.g., WS2, WSe2, WTe2, MoS2, MoSe2, MoTe2, HfS2, ZrS2, TiS2, GaSe, InSe, or phosphorene, etc.). The 2D materials may improve performances or characteristics of the transistors 120 (e.g., improved transconductance gm, improved gain bandwidth Ft, improved saturation current Idsat, etc.). The channel regions 145 may be formed by growing 2D materials on the dielectric nano sheets 140 through the trenches 195A, 195B, shown in FIG. 1A. In one aspect, ends of the channel regions 145 may overlap with or contact the exposed portions 1510 of the source/drain structures 180 to ensure that channels can be formed between source/drain structures 180.

After forming the channel regions 145, gate dielectric regions 155 may be formed on surfaces of the channel regions 145 facing along the Z-direction and not contacting the dielectric nano sheets 140. Each gate dielectric region 155 may extend along the X-direction and the Y-direction to form surfaces facing along the Z-direction. Each gate dielectric region 155 may include high-k dielectric material, such as $Si_3N_4$, $Al_2O_3$, $Ta_2O_5$, $TiO_2$, $ZrO_2$, and $HfO_2$. The gate dielectric regions 155 may be formed by a deposition process through the trenches 195A, 195B. The deposition of the gate dielectric regions 155 can be performed using any type of deposition technique, including but not limited to ALD, CVD, and PVD.

Figure 17:
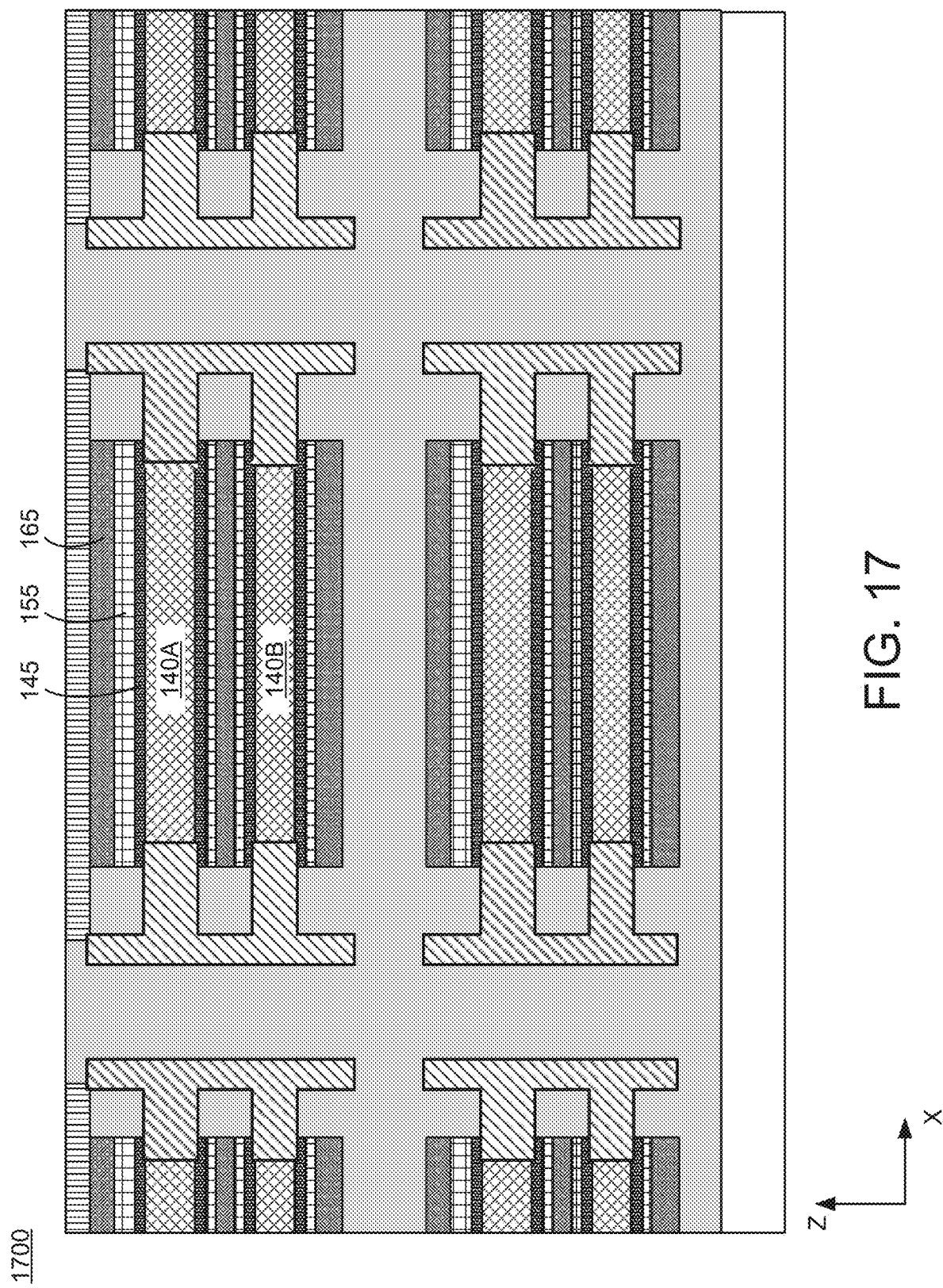

Referring to FIG. 17, illustrated is a cross-sectional view of the device 100 along I-I' in FIG. 1A, in the next stage 1700 of the process flow. As shown, in this stage 1700 in the process flow, gate structures 165 are formed. The gate structures 165 may be formed on surfaces of the gate dielectric regions 155 facing along the Z-direction and not contacting the channel regions 145. Each gate structure 165 may extend along the X-direction and the Y-direction to form surfaces facing along the Z-direction. The gate structures 165 may be formed by a deposition process through the trenches 195A, 195B. The deposition of the gate structures 165 can be performed using any type of deposition technique, including but not limited to ALD, CVD, and PVD.

Through the process as described in FIGS. 2-17, transistors 120 including the dielectric nano sheets 140 may be formed as GAA transistors with 2D materials. In one aspect, any number of nano sheets can be easily stacked along the vertical direction (e.g., Z-direction) to form a single transistor 120 having improved characteristics in an area efficient manner. In one aspect, any number of transistors 120 can be easily stacked along the vertical direction (e.g., Z-direction) to improve area efficiency. In one aspect, 2D materials allow significant boost in performance relative to Si, such that transistors 120 disclosed herein may have improved performances or characteristics (e.g., improved transconductance gm, improved gain bandwidth Ft, improved saturation current Idsat, etc.). Alternatively, the channel regions may be formed on less than all four sides, e.g., only on one side or two sides of the dielectric nano sheet. For example, providing the channel, gate dielectric, and gate structures on at least the z-direction facing major surfaces of the dielectric nano sheet may be suitable for some transistor applications.

Figure 18:
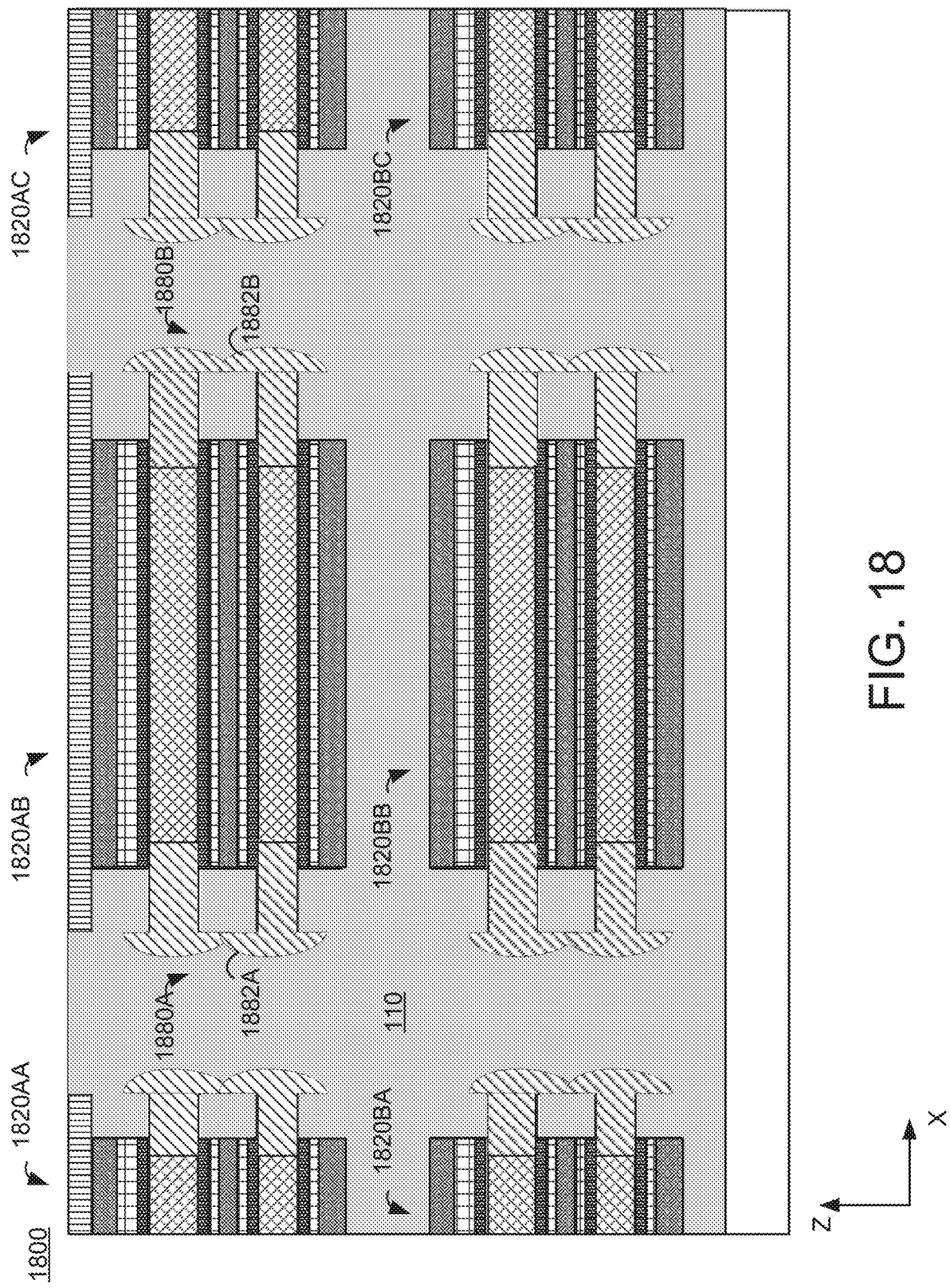
FIG. 18 is a cross-sectional view of another device including stacked transistors, according to an embodiment.
Figure 19:
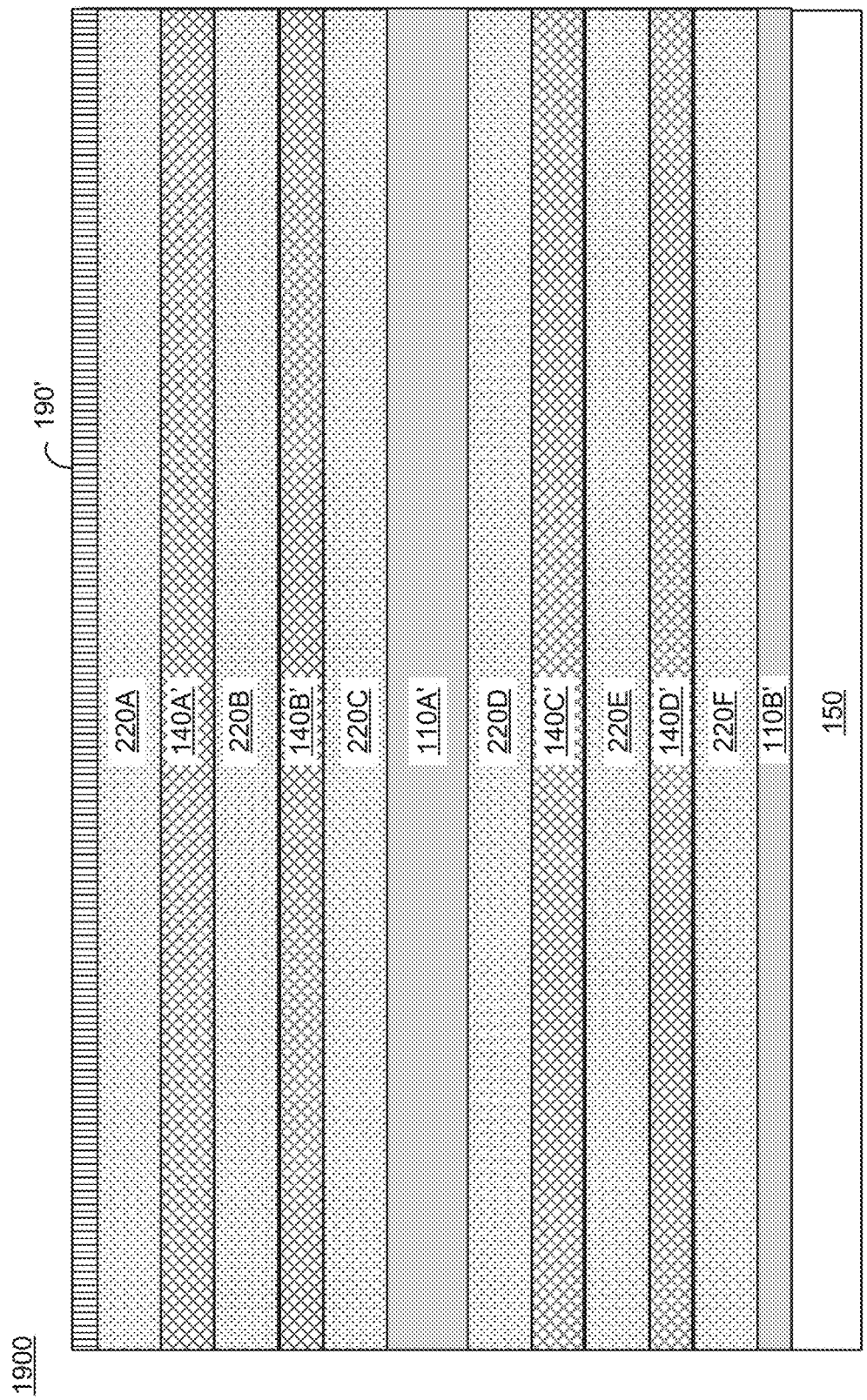
FIGS. 19-28 show top plan views and cross-sectional views of a process to form the another device including the stacked transistors, according to an embodiment.
Figure 20:
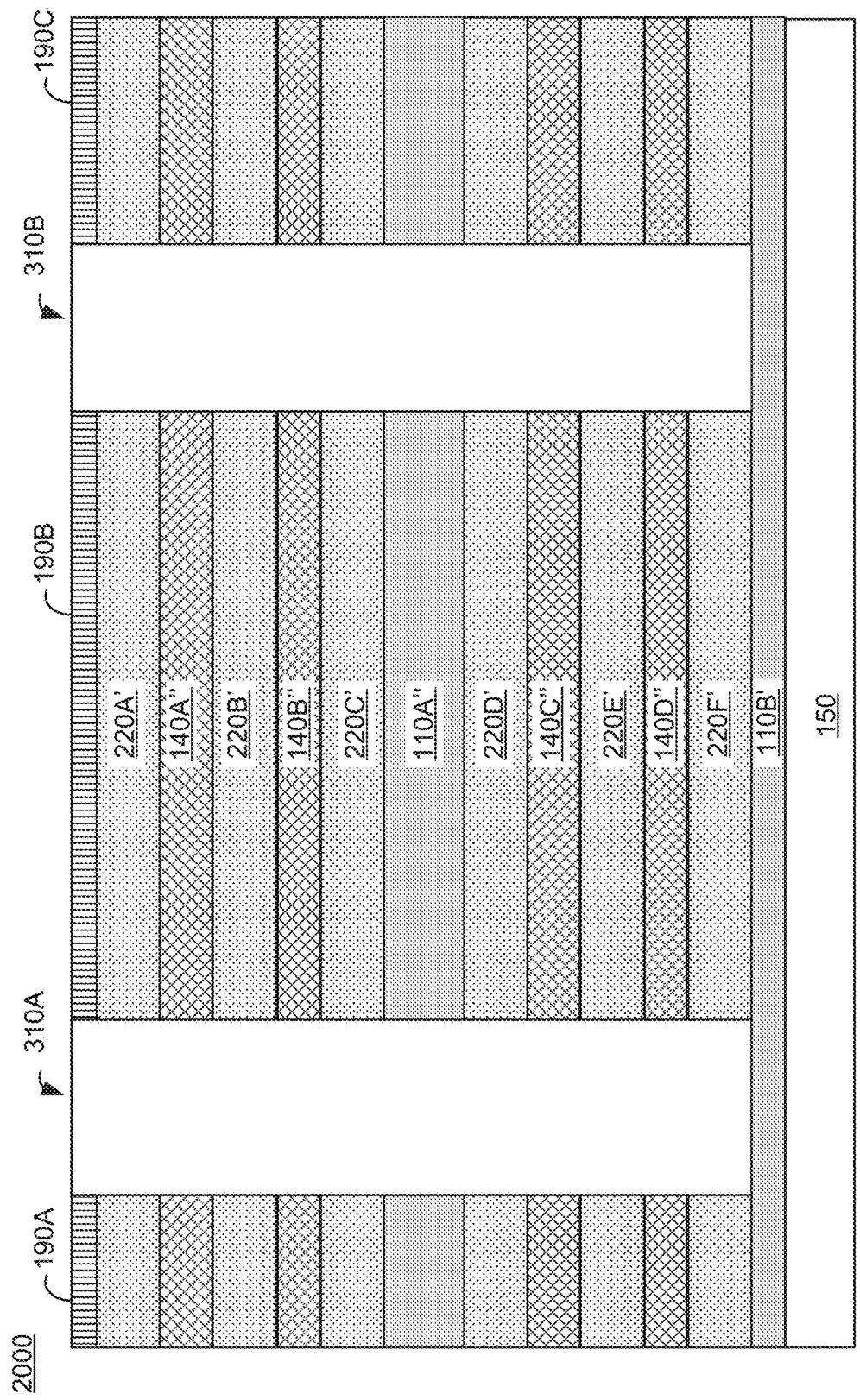
Figure 21:
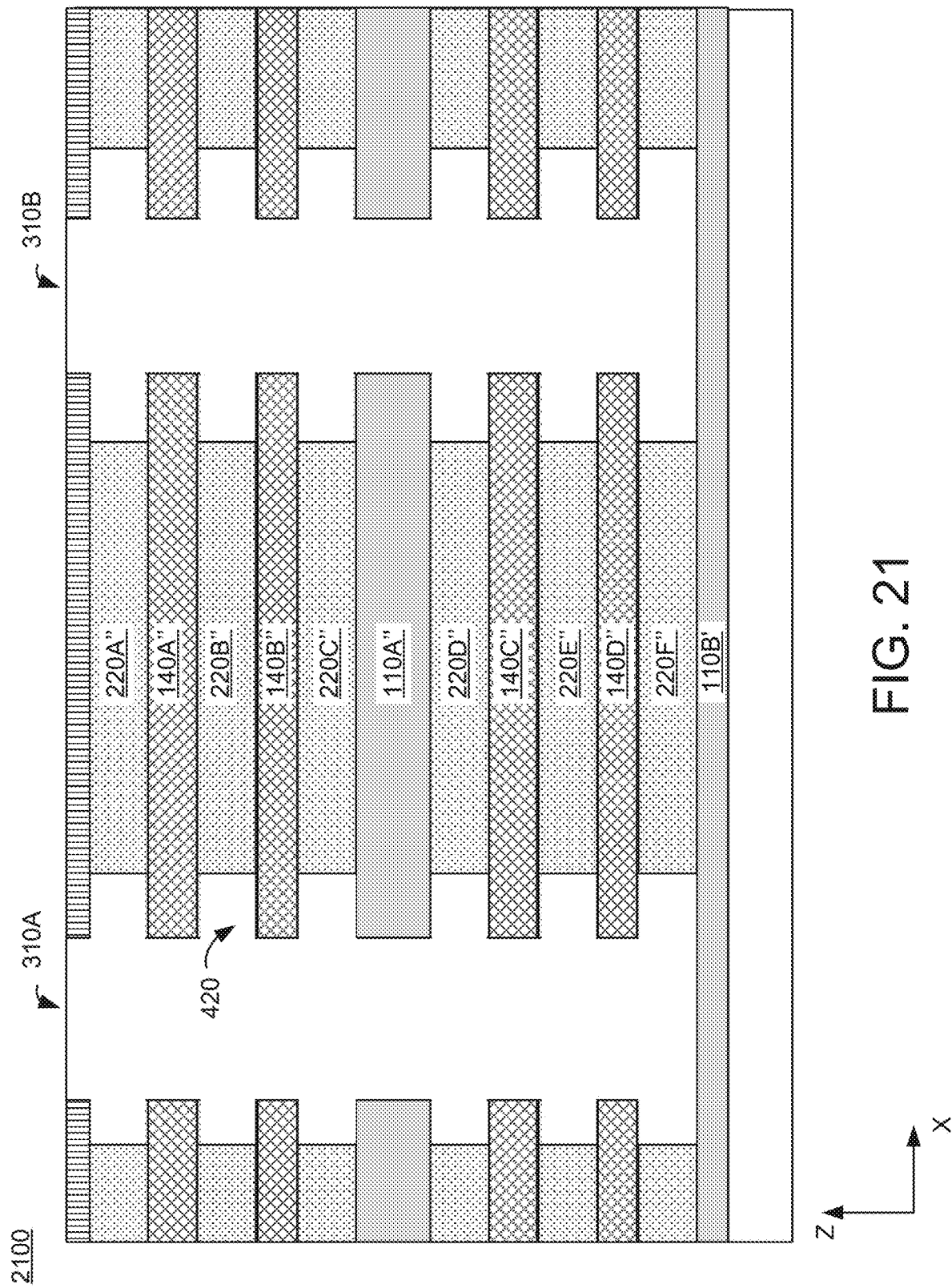
Figure 22:
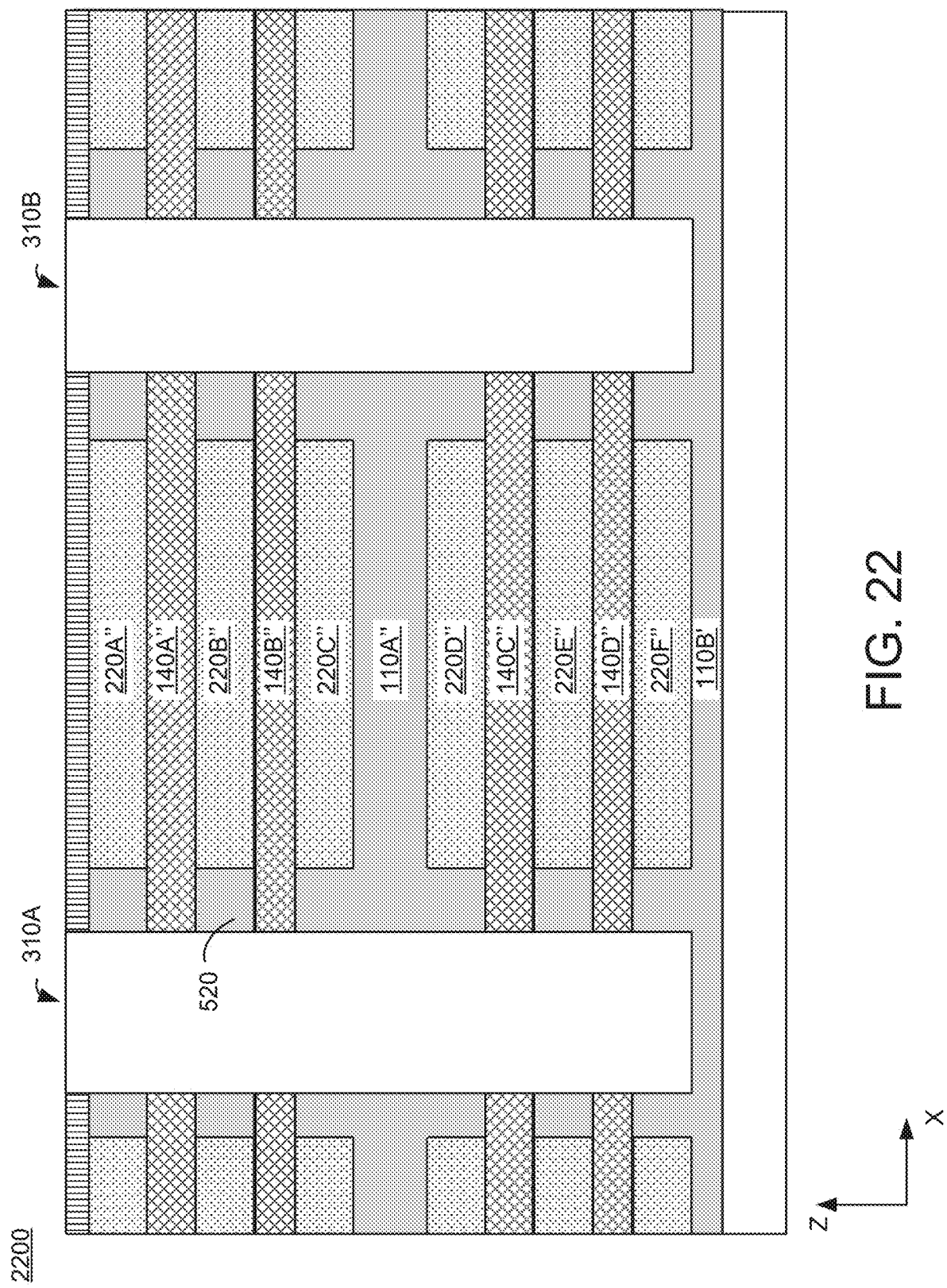

Referring to FIG. 18, illustrated is a cross-sectional view of the device 1800 including the stacked transistors 1820, according to an embodiment. The transistors 1820 are similar to the transistors 120 of the device 100 in FIG. 1B, except the transistors 1820 have source/drain structures 1880A, 1880B including bridge portions 1882A, 1882B with curved or non-flat surfaces. The remaining structures and configurations of the device 1800 are similar to those of the device 100. Thus, detailed description of duplicated portion thereof is omitted herein for the sake of brevity. The process of forming the device 1800 is provided below with respect to FIGS. 19-28.

FIGS. 19-28 show top plan views and cross-sectional views of a process to form the device 1800, according to an embodiment. Each of the FIGS. 19-28 generally refers to one or more process steps in a process flow, each of which is described in detail in connection with the respective Figure. For the purposes of simplicity and ease of visualization, some reference numbers may be omitted from some Figures. In one aspect, the same processes applied as described with respect to FIGS. 2-5 can be applied to obtain the dielectric nano sheets 140A-140D and dielectric layers 220A"-220F" stacked along the Z-direction and the trenches 310A, 310B as shown in FIGS. 19-22. Thus, detailed description of duplicated portion thereof is omitted herein for the sake of brevity.

Figure 23:
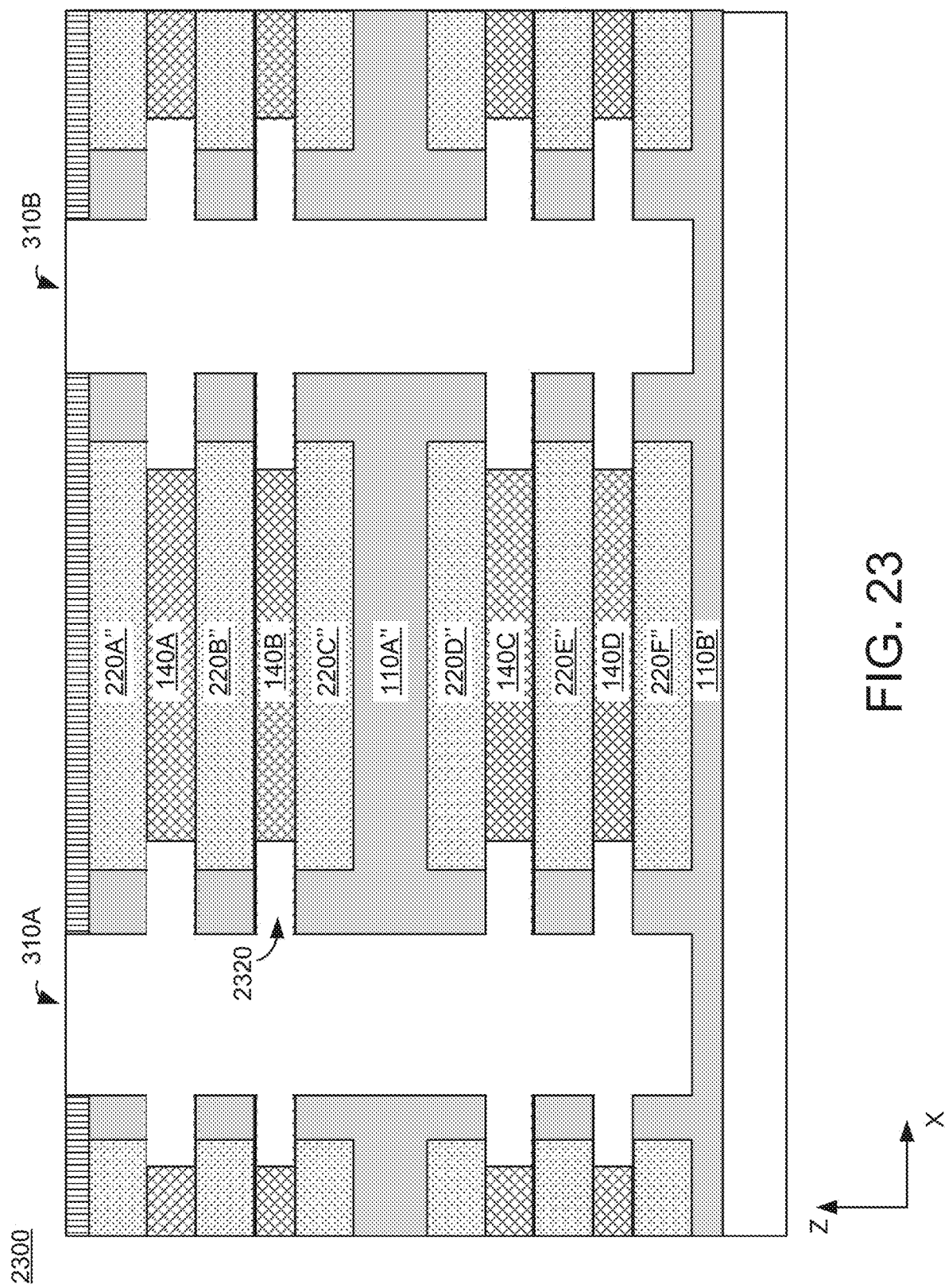

Referring to FIG. 23, illustrated is a cross-sectional view of the device 1800 along I-I' in FIG. 18, in the next stage 2300 of the process flow. As shown, in this stage 2300 in the process flow, end portions of the unit dielectric nano sheets 140A"-140D" can be removed to obtain or form dielectric nano sheets 140A-140D each having a smaller length than dielectric layers 220A"-220F". The end portions of the unit dielectric nano sheets 140A"-140D" may be removed by etching. Examples of etching may include dry etching, wet etching, plasma etching, RIE or any etching. By removing the end portions of the unit dielectric nano sheets 140A"-140D", indents 2320 can be formed on the sidewalls of the trenches 310A, 310B. In one aspect, the etching is performed, such that the unit dielectric nano sheets 140 may have smaller widths along the X-direction than the dielectric layers 220A"-220F".

Figure 24:
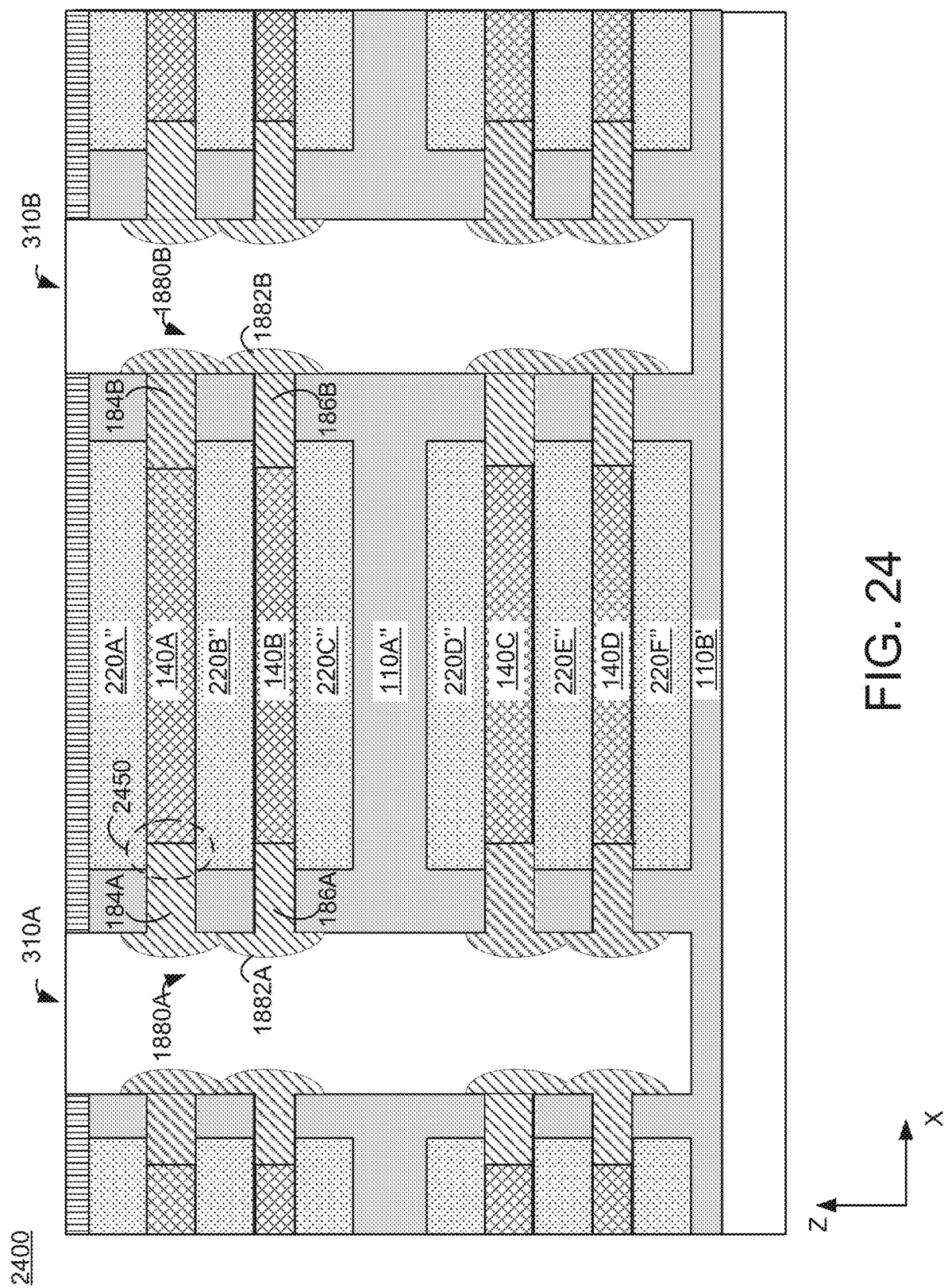

Referring to FIG. 24, illustrated is a cross-sectional view of the device 1800 along I-I' in FIG. 18, in the next stage 2400 of the process flow. As shown, in this stage 2400 in the process flow, the source/drain structures 1880A, 1880B are formed. The source/drain structures 1880A, 1880B may include the same materials as the source/drain structures 180A, 180B. In one approach, the source/drain structures 1880A, 1880B are formed by selectively growing metal in the indents 2320. Metal may be grown in the indents 2320, such that portions of the metal formed in the indents 2320 can be the contact portions 184A-184D of the source/drain structures 1880A, 1880B. In addition, a portion of the metal overgrown out of each indent 2320 may contact another portion of the metal overgrown out of its adjacent indent 2320 to form a bridge portion 1882. For example, the bridge portion 1882A is formed to couple the contact portions 184A, 186A, and the bridge portion 1882B is formed to couple the contact portions 184B, 186B. In one aspect, because the unit dielectric nano sheets 140 have smaller widths along the X-direction than the dielectric layers 220A"-220F", portions 2450 of the source/drain structures 2450 formed in the trenches 310A, 310B can contact end portions of the dielectric layers 220A"-220F" or end portions of the dielectric layers 220A"-220F" may overlap with the portions 2450 of the source/drain structures 1880 to ensure that channels can be formed between source/drain structures 1880.

Figure 25:
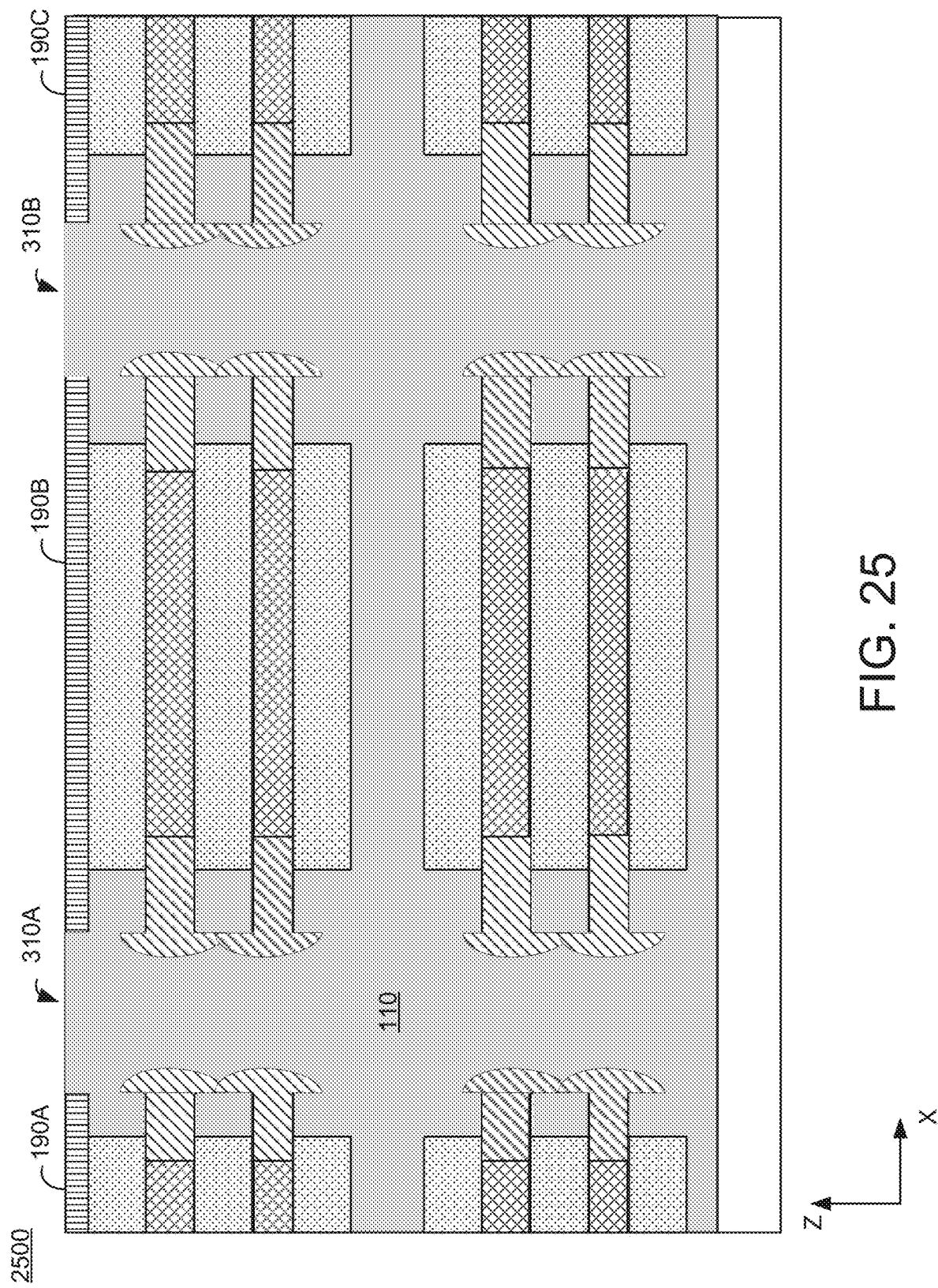

Referring to FIG. 25, illustrated is a cross-sectional view of the device 1800 along I-I' in FIG. 18, in the next stage 2500 of the process flow. As shown, in this stage 2500 in the process flow, the dielectric structures can be formed in the trenches 310A, 310B. The dielectric structures may include the same material (e.g., oxide) as the dielectric layer 110A". The dielectric structures can be formed to fill the trenches 310A, 310B to obtain the dielectric structure 110. The dielectric structures may be formed by a deposition process. The deposition of the dielectric structures can be performed using any type of deposition technique, including but not limited to ALD, CVD, and PVD. In one aspect, the dielectric structure 110 can operate as an insulator or a divider that can electrically separate or isolate different transistors 120. In some cases, a CMP process may be performed such that top surfaces of the dielectric structure 110 in the trenches 310A, 310B and the capping layers 190A, 190B, 190C can form a flushed surface.

Figure 26:
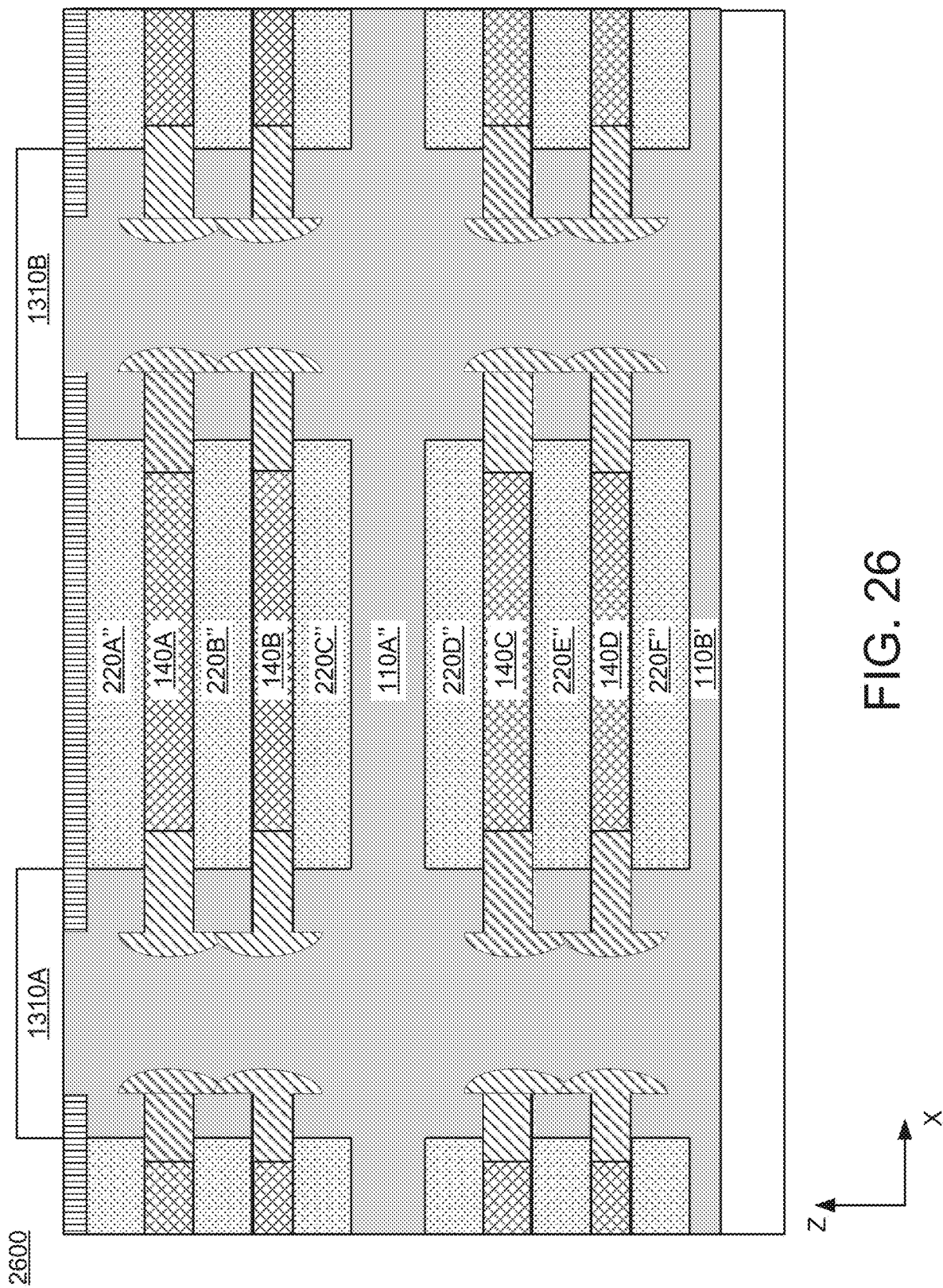
Figure 27:
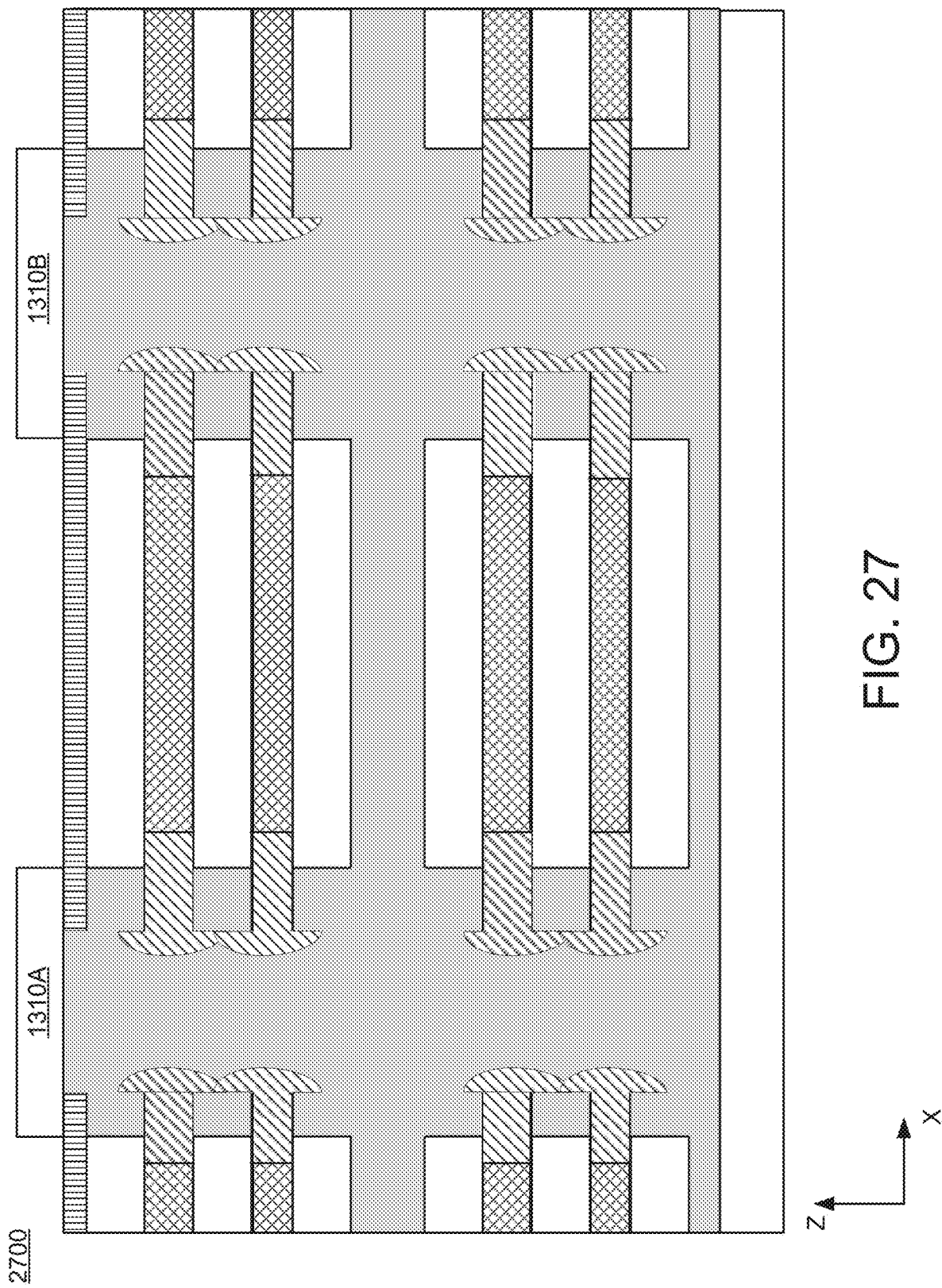
Figure 28:
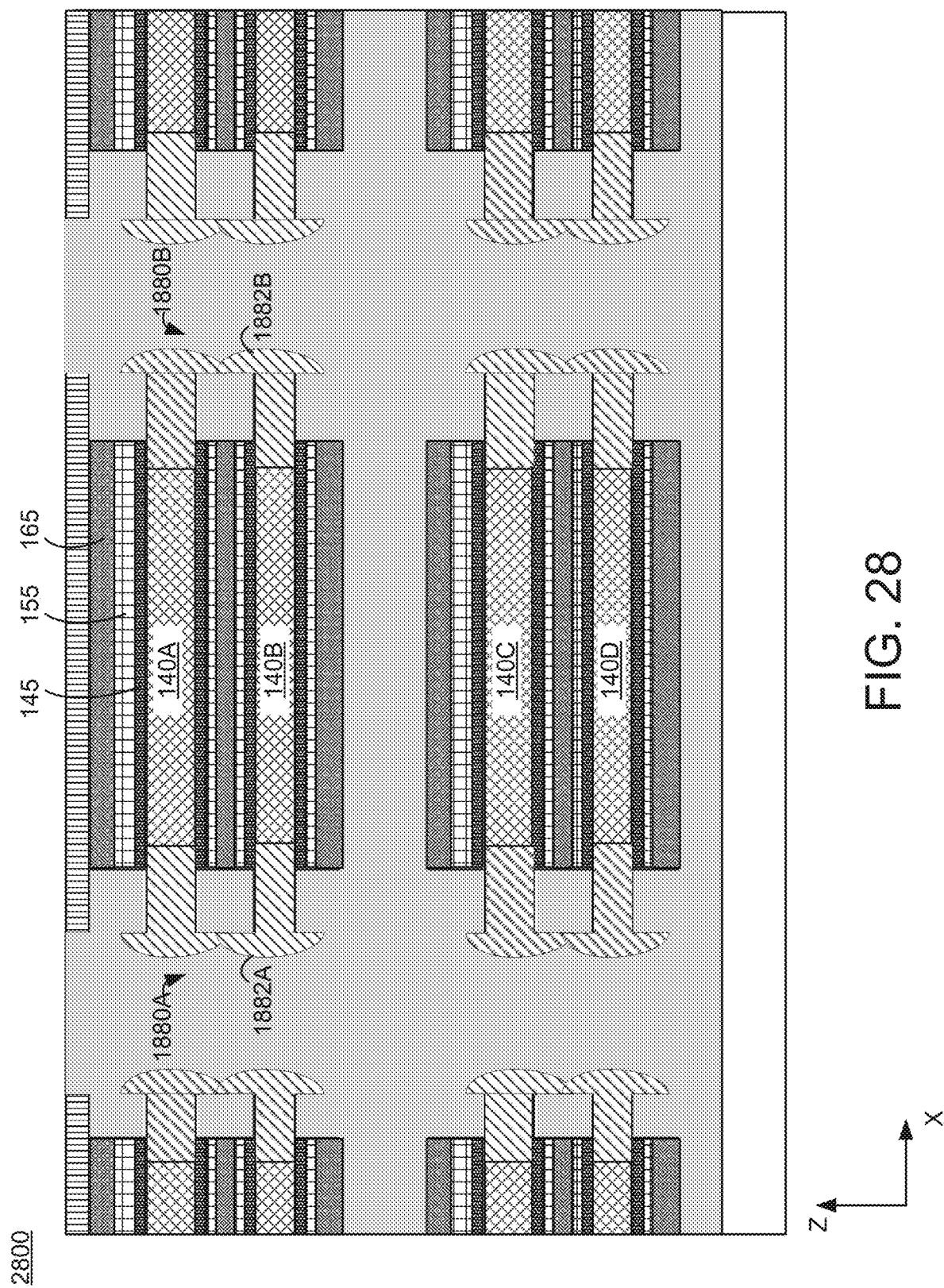

The remaining steps 2600-2800 for forming the device 1800 shown in FIGS. 26-28 are similar to the steps 1300-1700 for forming the device 100 as described with respect to FIGS. 13-17. Thus, detailed description of duplicated portion thereof is omitted herein for the sake of brevity. In one example, the photoresist masks 1310A, 1310B can be provided as shown in FIG. 26, and dielectric layers 220A"-220F" can be removed as shown in FIG. 27. Then, channel regions 145, gate dielectric regions 155, and gate structures 165 can be formed with respect to the dielectric nano sheets 140A-140D in a space, at which the dielectric layers 220A"-220F" are removed to obtain the device 1800 as shown in FIG. 29.

Advantageously, by forming the source/drain structures 1880 with overgrown metal, the device 1800 can be implemented with an efficient process as described with respect to FIGS. 18-28. For example, the steps 700-1100 for forming the source/drain structures 180 can be omitted or simplified. Hence, the device 1800 can be formed or implemented with fewer processing steps and fewer resources.

Referring now to FIG. 29, illustrated is a flow diagram of a process 2900 for forming one or more transistors including vertically stacked nano sheets. The process 2900 can be performed by a fabrication facility or a fabrication device. The process 2900 may include steps 2910-2980. However, other embodiments may include additional or alternative steps, or may omit one or more steps altogether.

At step 2910, the process 2900 can include forming a set of initial dielectric layers 220 and a set of initial dielectric nano sheets 140'. The set of initial dielectric layers 220 and a set of initial dielectric nano sheets 140' can be formed above the substrate 150 along the Z-direction. Forming the set of initial dielectric layers 220 and the set of initial dielectric nano sheets 140' can be performed, as described above with respect to FIG. 2. For example, the layers 150, 110B', 220F, 140D', 220E, 140C', 220D, 110A', 220C, 140B', 220B, 140A', 220A, and 190' may be stacked along the Z-direction in that sequence. In one aspect, each of the layers 140A'-140D' is formed or disposed between corresponding two of the layers 220A-220F. The layers 150, 110B', 220F, 140D', 220E, 140C', 220D, 110A', 220C, 140B', 220B, 140A', 220A, and 190' may be formed by a series of deposition processes. The deposition of the layers 150, 110B', 220F, 140D', 220E, 140C', 220D, 110A', 220C, 140B', 220B, 140A', 220A, and 190' can be performed using any type of deposition technique, including but not limited to ALD, CVD, and PVD.

At step 2920, the process 2900 can include forming trenches 310 in the set of initial dielectric layers 220 and the set of initial dielectric nano sheets 140' to obtain a set of unit dielectric layers 220' and a set of unit dielectric nano sheets 140". Forming the trenches 310 can be performed, as described above with respect to FIG. 3. For example, vertical portions of the layers 220F, 140D', 220E, 140C', 220D, 110A', 220C, 140B', 220B, 140A', 220A, and 190' along the Z-direction are removed to form trenches 310A, 310B. Edges of the remaining portions of the layers 220F, 140D', 220E, 140C', 220D, 110A', 220C, 140B', 220B, 140A', 220A, and 190' may be aligned and form a flushed surface facing along the X-direction (or horizontal direction). The flushed surfaces facing along the X-direction may constitute sidewalls of the trenches 310A, 310B. In one approach, the vertical portions of the layers 220F, 140D', 220E, 140C', 220D, 110A', 220C, 140B', 220B, 140A', 220A, and 190' may be removed by etching. Examples of etching may include dry etching, wet etching, plasma etching, RIE or any etching. The layers 220F, 140D', 220E, 140C', 220D, 110A', 220C, 140B', 220B, 140A', 220A, and 190' may be removed by a single etching process, or a series of etching processes. By removing the vertical portions of the layers, unit layers 220F', 140D'', 220E', 140C'', 220D', 110A'', 220C', 140B'', 220B', 140A'', and 220A'', each having the same length along the X-direction can be formed. Moreover, by removing the vertical portions of the layers, the capping layers 190A, 190B, 190C can be obtained or formed.

At step 2930, the process 2900 can include obtaining a set of dielectric layers 220'' and a set of dielectric nano sheets 140. The set of dielectric nano sheets may include $SiO_2$. Obtaining the set of dielectric layers 220'' and the set of dielectric nano sheets 140 can be performed, as described above with respect to FIGS. 4-6.

For example, end portions of the unit dielectric layers 220A'-220F' can be removed to obtain or form dielectric layers 220A''-220F'' each having a smaller length along the X-direction compared to the unit dielectric layers 220A'-220F'. The end portions of the unit dielectric layers 220A'-220F' may be removed by etching. Examples of etching may include dry etching, wet etching, plasma etching, RIE or any etching. By removing the end portions of the unit dielectric layers 220A'-220F', indents 420 can be formed on the sidewalls of the trenches 310A, 310B.

Then, for example, dielectric structures 520 may be formed in indents 420 corresponding to the removed portions in FIG. 4. The dielectric structures 520 may include the same materials as the dielectric layers 110A', 110B'. The dielectric structures 520 may be formed by a deposition process. The deposition of the dielectric structures 520 can be performed using any type of deposition technique, including but not limited to ALD, CVD, and PVD. By forming the dielectric structures 520, the indents 420 can be filled, such that the sidewalls of the trenches 310A, 310B can have flushed surfaces facing along the X-direction. In some cases, etching can be performed to remove remnants or portions of the dielectric structures 520 out of the indents 420, such that the sidewalls of the trenches 310A, 310B can have flushed surfaces facing along the X-direction.

Then, for example, end portions of the unit dielectric nano sheets 140A''-140D'' can be removed to obtain or form dielectric nano sheets 140A-140D each having a smaller length along the X-direction compared to the unit dielectric nano sheets 140A''-140D''. The end portions of the unit dielectric nano sheets 140A''-140D'' may be removed by etching. Examples of etching may include dry etching, wet etching, plasma etching, RIE or any etching. By removing the end portions of the unit dielectric nano sheets 140A''-140D'', indents 620 or 2320 can be formed on the sidewalls of the trenches 310A, 310B.

At step 2940, the process 2900 can include forming source/drain structures 180 or 1880. Forming the source/drain structures 180 can be performed as described above with respect to FIGS. 7-12 or with respect to FIG. 30. Forming the source/drain structures 1880 can be performed as described above with respect to FIGS. 24-25 or with respect to FIG. 31.

At step 2950, the process 2900 can include removing the set of dielectric layers 220''. Removing the dielectric layers 220'' can be performed as described above with respect to FIGS. 13-15. For example, photoresist masks 1310A, 1310B can be placed on the top surface of the device 100. The photoresist masks 1310A, 1310B may protect or cover the source/drain structures 180 along the Z-direction. The photoresist masks 1310A, 1310B may have openings that expose the dielectric nano sheets 140A-140D and dielectric layers 220A''-220F'' along the Z-direction. Then, the dielectric layers 220A''-220F'' may be removed by etching through openings of the photoresist masks 1310A, 1310B. The examples of etching may include dry etching, wet etching, plasma etching, RIE or any etching. Etching may be performed with materials or a process reactive to the dielectric layers 220A''-220F'', but not reactive to the dielectric nano sheets 140A-140D, such that the dielectric layers 220A''-220F'' can be removed while the dielectric nano sheets 140A-140D may remain unremoved. The photoresist masks 1310A, 1310B may protect the source/drain structures 180 along the Z-direction. After removing the set of dielectric layers 220'', the photoresist masks 1310A, 1310B can be removed.

At step 2960, the process 2900 can include forming channel regions 145. Forming the channel regions 145 can be performed as described above with respect to FIG. 16. For example, the channel regions 145 may be formed on surfaces (e.g., top surfaces and bottom surfaces) of the dielectric nano sheets 140 facing along the Z-direction. Each channel region 145 may extend along the X-direction and the Y-direction to form surfaces facing along the Z-direction. Each channel region 145 may include 2D materials (e.g., WS2, WSe2, WTe2, MoS2, MoSe2, MoTe2, HfS2, ZrS2, TiS2, GaSe, InSe, or phosphorene, etc.). The 2D materials may improve performances or characteristics of the transistors 120 (e.g., improved transconductance gm, improved gain bandwidth Ft, improved saturation current Idsat, etc.). The channel regions 145 may be formed by growing 2D materials on the dielectric nano sheets 140 through the trenches 195A, 195B.

At step 2970, the process 2900 can include forming gate dielectric regions 155. Forming the gate dielectric regions 155 can be performed as described above with respect to FIG. 16. For example, gate dielectric regions 155 may be formed on surfaces of the channel regions 145 facing along the Z-direction and not contacting the dielectric nano sheets 140. Each gate dielectric region 155 may extend along the X-direction and the Y-direction to form surfaces facing along the Z-direction. Each gate dielectric region 155 may include high-k dielectric material, such as $Si_3N_4$, $Al_2O_3$, $Ta_2O_5$, $TiO_2$, $ZrO_2$, and $HfO_2$. The gate dielectric regions 155 may be formed by a deposition process through the trenches 195A, 195B. The deposition of the gate dielectric regions 155 can be performed using any type of deposition technique, including but not limited to ALD, CVD, and PVD.

At step 2980, the process 2900 can include forming gate structures 165. Forming the gate structures 170 can be performed as described above with respect to FIG. 17. For example, the gate structures 165 may be formed on surfaces of the gate dielectric regions 155 facing along the Z-direction and not contacting the channel regions 145. Each gate structure 165 may extend along the X-direction and the Y-direction to form surfaces facing along the Z-direction. The gate structures 165 may be formed by a deposition process through the trenches 195A, 195B. The deposition of the gate structures 165 can be performed using any type of deposition technique, including but not limited to ALD, CVD, and PVD.

FIG. 30 is a flow chart showing a process 3000 of forming source/drain structures 180, according to an embodiment. The process 3000 may be performed as the step 2940 in FIG. 29. The process 3000 can be performed by a fabrication facility or a fabrication device. The process 3000 may include steps 3010-3030. However, other embodiments may include additional or alternative steps, or may omit one or more steps altogether.

At step 3010, the process 3000 can include depositing metal in trenches 310 to fill the indents 620, such that portions of the metal in the indents 620 can contact a set of dielectric nano sheets 140. Depositing metal in trenches 310 to fill indents 620 can be performed as described above with respect to FIG. 7. For example, metal structures 710A, 710B can be formed in the trenches 310A, 310B by depositing metal in the trenches 310A, 310B. The metal structures 710A, 710B may include the same materials as the source/drain structures 180. The metal structures 710A, 710B may be formed by a deposition process. The deposition of the metal structures 710A, 710B can be performed using any type of deposition technique, including but not limited to ALD, CVD, and PVD.

After depositing the metal in the trenches 310, a top portion of the metal structure can be removed as described above with respect to FIG. 8, such that a bottom portion of the metal structures 710 can remain unremoved. For example, the bottom portions (e.g., metal structures 810A, 810B) may have a height along the Z-direction that is same as or corresponds to a height of the stack of layers 220D"-220F" and 140C, 140D along the Z-direction. The top portions of the metal structures 710A, 710B may be removed by etching. Examples of etching may include dry etching, wet etching, plasma etching, RIE or any etching. By removing the top portions of the metal structures 710A, 710B, portions of the metal structures 710A, 710B may remain in the indents 620 adjacent to dielectric nano sheets 140A, 140B to form contact portions 184A, 186A, 184B, 186B of the source/drain structures for the transistor 120AB.

Then, dielectric structures 910A, 910B can be formed in the trenches 310A, 310B, as described above with respect to FIG. 9. The dielectric structures 910A, 910B may include the same material as the dielectric layer 110A". The dielectric structures 910A, 910B may be formed, such that top surfaces of the dielectric structures 910A, 910B may be on the same level as the bottom surface of the dielectric layer 220C". The dielectric structures 910A, 910B may be formed by a deposition process. The deposition of the dielectric structures 910A, 910B can be performed using any type of deposition technique, including but not limited to ALD, CVD, and PVD. In some cases, a CMP process may be performed such that top surfaces of the dielectric structures 910A, 910B can be polished.

Then, metal structures 1010A, 1010B can be formed in the remaining portions of the trenches 310A, 310B, as described above with respect to FIG. 10. The metal structures 1010A, 1010B may include the same materials as the source/drain structures 180. The metal structures 1010A, 1010B may be formed by a deposition process. The deposition of the metal structures 1010A, 1010B can be performed using any type of deposition technique, including but not limited to ALD, CVD, and PVD. In some cases, a CMP process may be performed such that top surfaces of the metal structures 1010A, 1010B and the capping layers 190A, 190B, 190C can form a flushed surface.

At step 3020, the process 3000 can include removing a portion of the metal in the trench 310 along a vertical direction. Removing the portion of the metal in the trench 310 along the vertical direction (e.g., Z-direction) can be performed as described above with respect to FIG. 11. For example, vertical portions of the metal structures 810A, 810B, 1010A, 1010B, and dielectric structures 910A, 910B along the Z-direction can be removed to form trenches 1110A, 1110B. In one approach, the vertical portions of the metal structures 810A, 810B, 1010A, 1010B, and dielectric structures 910A, 910B may be removed by etching. Top edge portions of the metal structures 1010A, 1010B adjacent to the capping layers 190A, 190B, 190C along the X-direction may be removed as well. Examples of etching may include dry etching, wet etching, plasma etching, RIE or any etching. The vertical portions of the metal structures 810A, 810B, 1010A, 1010B, and dielectric structures 910A, 910B may be removed by a single etching process, or a series of etching processes. By removing the vertical portions of the metal structures 810A, 810B, 1010A, 1010B, and dielectric structures 910A, 910B, source/drain structures 180 of transistors 120A, 120B can be formed. For example, the source/drain structure 180A may include contact portions 184A, 186A directly contacting ends of the dielectric nano sheets 140A, 140B, and a bridge portion 182A extending along the Z-direction and coupled to the contact portions 184A, 186A. Similarly, the source/drain structure 180B may include contact portions 184B, 186B directly contacting ends of the dielectric nano sheets 140A, 140B, and a bridge portion 182B extending along the Z-direction and coupled to the contact portions 184B, 186B.

At step 3030, the process 3000 can include depositing a dielectric material in the trench 1110 along the vertical direction (e.g., Z-direction). The dielectric material may be the same material (e.g., oxide) of the dielectric layer 110A" or the dielectric structure 110. Depositing the dielectric material in the trench 1110 along the vertical direction can be performed as described above with respect to FIG. 12. For example, dielectric structures can be formed to fill the trenches 1110A, 1110B to obtain the dielectric structure 110. The dielectric structures may be formed by a deposition process. The deposition of the dielectric structures can be performed using any type of deposition technique, including but not limited to ALD, CVD, and PVD. In one aspect, the dielectric structure 110 can operate as an insulator or a divider that can electrically separate or isolate different transistors 120. In some cases, a CMP process may be performed such that top surfaces of the dielectric structure 110 in the trenches 1110A, 1110B and the capping layers 190A, 190B, 190C can form a flushed surface.

Figure 31:
FIG. 31 is a flow chart showing another process of forming source/drain structures, according to an embodiment.

FIG. 31 is a flow chart showing another process 3100 of forming source/drain structures 1880, according to an embodiment. The process 3100 may be performed as the step 2940 in FIG. 29. The process 3100 can be performed by a fabrication facility or a fabrication device. The process 3100 may include steps 3110-3120. However, other embodiments may include additional or alternative steps, or may omit one or more steps altogether.

At step 3110, the process 3100 can include selectively growing metal in indents 2320. Selectively growing metal in indents 2320 can be performed as described above with respect to FIG. 24. For example, metal may be grown in the indents 2320, such that portions of the metal formed in the indents 2320 can be the contact portions 184A-184D of the source/drain structures 1880A, 1880B. In addition, a portion of the metal overgrown out of each indent 2320 may contact another portion of the metal overgrown out of its adjacent indent 2320 to form a bridge portion 1882. For example, the bridge portion 1882A is formed to couple the contact portions 184A, 186A, and the bridge portion 1882B is formed to couple the contact portions 184B, 186B.

At step 3120, the process 3100 can include depositing a dielectric material in the indent 2320. The dielectric material may be the same material (e.g., oxide) of the dielectric layer 110A" or the dielectric structure 110. Depositing the dielectric material in the indent 2320 can be performed as described above with respect to FIG. 25. For example, the dielectric structures can be formed to fill the trenches 310A, 310B to obtain the dielectric structure 110. The dielectric structures may be formed by a deposition process. The deposition of the dielectric structures can be performed using any type of deposition technique, including but not limited to ALD, CVD, and PVD. In one aspect, the dielectric structure 110 can operate as an insulator or a divider that can electrically separate or isolate different transistors 120. In some cases, a CMP process may be performed such that top surfaces of the dielectric structure 110 in the trenches 310A, 310B and the capping layers 190A, 190B, 190C can form a flushed surface.

By forming the source/drain structures 1880 with overgrown metal as described in the process 3100, the device 1800 can be formed with an efficient process. For example, the steps 700-1100 for forming the source/drain structures 180 can be omitted or simplified, such that the device 1800 can be formed or implemented with a fewer processing steps and with fewer resources.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A method comprising:
forming a set of dielectric layers and a set of dielectric nano sheets above a substrate, each of the set of dielectric layers and each of the set of dielectric nano sheets extending parallel to the substrate, and each of the set of dielectric nano sheets interposed between corresponding two dielectric layers of the set of dielectric layers;
removing a portion of material from each side of each of the dielectric layers in the set of dielectric layers;
forming dielectric structures of a different dielectric material to each area created by the removing the portion of material;
removing respective end portions of the dielectric nano sheets to form indents, wherein each of the indents is recessed toward a corresponding one of the dielectric nano sheets from a corresponding pair of the dielectric structures; and
forming a first source/drain structure and a second source/drain structure, the first source/drain structure coupled to first ends of the set of dielectric nano sheets, and the second source/drain structure coupled to second ends of the set of dielectric nano sheets.

2. The method of claim 1, further comprising:
removing the set of dielectric layers;
forming channel regions on the set of dielectric nano sheets;
forming gate dielectric regions on the channel regions; and
forming gate structures on the gate dielectric regions.

3. The method of claim 2, wherein the channel regions include at least one of WS2, WSe2, WTe2, MoS2, MoSe2, MoTe2, HfS2, ZrS2, TiS2, GaSe, InSe, or phosphorene.

4. The method of claim 2, wherein removing the set of dielectric layers includes:
placing a photoresist mask to cover the first source/drain structure and the second source/drain structure, the photoresist mask having an opening that exposes the set of dielectric layers; and
etching the set of dielectric layers through the opening of the photoresist mask.

5. The method of claim 1, wherein the set of dielectric layers is a first set of dielectric layers and the set of dielectric nano sheets is a first set of dielectric nano sheets, the method further comprising:
forming, a second set of dielectric layers and a second set of dielectric nano sheets above the first set of dielectric layers and the first set of dielectric nano sheets, each of the second set of dielectric layers and each of the second set of dielectric nano sheets extending along a first direction, the second set of dielectric layers and the second set of dielectric nano sheets stacked along a second direction, each of the second set of dielectric nano sheets interposed between corresponding two dielectric layers of the second set of dielectric layers; and
forming a third source/drain structure and a fourth source/drain structure, the third source/drain structure coupled to third ends of the second set of dielectric nano sheets, the fourth source/drain structure coupled to fourth ends of the second set of dielectric nano sheets, the third source/drain structure disposed above the first source/drain structure, the fourth source/drain structure disposed above the second source/drain structure.

6. The method of claim 5, wherein the second set of dielectric layers and the second set of dielectric nano sheets are formed prior to forming the first source/drain structure, the second source/drain structure, the third source/drain structure, and the fourth source/drain structure.

7. The method of claim 5, further comprising:
removing the first set of dielectric layers and the second set of dielectric layers, after forming the first source/drain structure, the second source/drain structure, the third source/drain structure, and the fourth source/drain structure;
forming channel regions on the first set of dielectric nano sheets and the second set of dielectric nano sheets, after removing the first set of dielectric layers and the second set of dielectric layers;
forming gate dielectric regions on the channel regions; and
forming gate structures on the gate dielectric regions.

8. The method of claim 7, wherein removing the first set of dielectric layers and the second set of dielectric layers, forming the channel regions on the first set of dielectric nano sheets and the second set of dielectric nano sheets, forming the gate dielectric regions on the channel regions, and forming the gate structures on the gate dielectric regions are performed while a capping layer is above the first set of dielectric nano sheets and the second set of dielectric nano sheets, the channel regions formed on all exposed sides of the first and second sets of dielectric nano sheets, the gate dielectric regions formed on all exposed sides of the channels, and the gate structures formed on all exposed sides of the gate dielectric regions.

9. The method of claim 8, wherein the gate structures formed on each of the first set of dielectric nano sheets extend between the dielectric nano sheets of the first set of dielectric nano sheets as part of a first gate all around (GAA) structure, and wherein the gate structures formed on each of the second set of dielectric nano sheets extend between the dielectric nano sheets of the second set of dielectric nano sheets as part of a second GAA structure.

10. The method of claim 1, wherein forming the first source/drain structure and the second source/drain structure includes:
depositing metal in the indents in an area outside of the indents; and
removing a portion of the metal in the area outside of the indents.

11. The method of claim 1, wherein forming the first source/drain structure and the second source/drain structure includes:
selectively growing metal in the indents, a portion of the metal extending out of the indents.

* * * * *